United States Patent [19]
Sano et al.

[11] Patent Number: 5,432,014
[45] Date of Patent: Jul. 11, 1995

[54] ORGANIC ELECTROLUMINESCENT ELEMENT AND A METHOD FOR PRODUCING THE SAME

[75] Inventors: Takeshi Sano; Masayuki Fujita; Takanori Fujii; Yoshitaka Nishio; Yuji Hamada, all of Osaka; Kenichi Shibata, Wakayama; Kazuhiko Kuroki, Kyoto, all of Japan

[73] Assignee: Sanyo Electric Co., Ltd., Osaka, Japan

[21] Appl. No.: 982,665

[22] Filed: Nov. 25, 1992

[30] Foreign Application Priority Data

Nov. 28, 1991 [JP] Japan .................. 3-314618
Mar. 26, 1992 [JP] Japan .................. 4-068458
May 20, 1992 [JP] Japan .................. 4-127703
Nov. 25, 1992 [JP] Japan .................. 4-315138

[51] Int. Cl.⁶ ............................. H05B 33/14
[52] U.S. Cl. .................. 428/690; 428/691; 428/917; 313/503; 313/504; 313/506
[58] Field of Search ............ 428/690, 917, 691; 313/503, 504, 506

[56] References Cited

U.S. PATENT DOCUMENTS 4,769,292  9/1988  Tang et al. .................. 428/690

Primary Examiner—Charles R. Nold
Attorney, Agent, or Firm—Merchant, Gould, Smith, Edell, Welter & Schmidt

[57] ABSTRACT

There is disclosed an electroluminescent (EL) element having an electron injection electrode, a hole injection electrode, and at least one layer therebetween, the layer comprising either a Rhodamine metal complex, a chromone metal complex, an azomethine metal complex, or another metal complex whose ligand is either thiobromine, flaviosin, or acriflavine.

64 Claims, 3 Drawing Sheets

ORGANIC ELECTROLUMINESCENT ELEMENT AND A METHOD FOR PRODUCING THE SAME

BACKGROUND OF THE INVENTION (1) Field of the Invention

This invention relates to an organic electroluminescent element, and more particularly to such an element having improved durability, and a producing method thereof.

(2) Related Arts

Recently, in accordance with the diversification of information apparatuses, the demand for flat-type display elements has been growing which manage with less electric power and smaller space than cathode-ray tubes (CRT). Included in such flat-type display elements are crystalline liquid display elements and plasma display elements, and drawing special attention among them is an electroluminescent (hereinafter referred to as EL) element which is a self-luminescent type and can provide clear display.

Here, the EL elements can be divided between inorganic and organic depending on the constituent materials, the former having already been put to practical use.

However, such an inorganic EL element needs to be driven with high voltage because its driving type is a so-called 'collisional excitation type' wherein electrons accelerated by the impression of a high electrical field make the luminescence center luminesce through the collisional excitation. This construction brings about an increase in the cost of surrounding devices. On the other hand, the organic EL element can be driven with low voltage because it exhibits so-called 'injection type luminescence' wherein charges (holes injected from an electrode and electrons injected from another) are combined with each other inside luminous materials to produce luminescence. It has another advantage of being able to easily produce any desired luminous colors by altering the molecular structure of the organic compound. Hence, such organic EL elements are very hopeful as new display elements.

The organic EL elements generally have either two-layer or three-layer structure. The two-layer structure has either SH-A structure wherein a luminous layer and a hole transport layer are formed between a hole injection electrode and an electron injection electrode, or SH-B structure wherein a luminous layer and an electron transport layer are formed between these electrodes. The three-layer structure has DH structure wherein a luminous layer, a hole transport layer, and an electron transport layer are formed between these electrodes. Used for such hole injection electrodes are materials having a large work function such as gold and ITO (In-Sn oxide), while used for such electron injection electrodes are materials having a small work function such as Mg. All the layers comprise organic materials: the hole transport layer comprises a material having p-type semiconductor characteristics, the electron transport layer comprises a material having n-type semiconductor characteristics, and the luminous layer comprises a material having n-type semi-conductor characteristics when used in the SH-A structure, a material having p-type semi-conductor characteristics when used in the SH-B structure, and a material having characteristics close to neutral when used in the DH structure. Every structure described above is based on the common principle that holes injected from a hole injection electrode and electrons injected from an electron injection electrode are combined on the boundary surface between a luminous layer and a hole (or electron) transport layer as well as inside the luminous layer to produce luminescence.

As mentioned before, the organic EL elements have advantages of being driven with low voltage, producing any desirable luminous colors theoretically, and the like. However, when it comes to the luminous durability, very few of them can retain stable luminescence. Thus, improving the durability has been an important subject.

The short lives of the present organic EL elements result from that the poor film-forming properties of the materials of the luminous layers and the electron transport layers cause undesired precipitates between adjacent layers laminated.

Another drawback of the organic EL elements is that even if both the electrodes are impressed low voltage to drive the elements, the electric fields among the elements are as high as $10^5$ V/cm, which may cause electron avalanche and then dielectric breakdown.

Further another drawback of the organic EL elements which comprise organic compounds is that their conductivity is low, so that the mobility of the carriers becomes low while the resistance becomes high. As a result, when voltage is impressed between the electrodes, the resistance of elements produces heat, which serves to melt or decompose the organic luminous layers, changing the luminous colors or hindering the emission.

SUMMARY OF THE INVENTION

Therefore, an object of this invention is to provide a useful EL element which has excellent durability and retains stable luminescence for a long period of time.

The object can be achieved by an EL element having an electron injection electrode, a hole injection electrode, and at least one layer therebetween comprising either a Rhodamine metal complex, a chromone metal complex, or an azomethine metal complex.

There may be two layers between the electrodes, one being an organic luminous layer, the other being an organic hole transport layer, and the organic hole transport layer being provided between the organic luminous layer and the hole injection electrode.

The organic luminous layer may comprise a Rhodamine metal complex, and the organic hole transport layer may comprise an organic compound that has less exciton energy than the Rhodamine metal complex.

A metal of the Rhodamine metal complex may belong to the group III in the periodic table.

The Rhodamine metal complex may comprise a compound shown in chemical formula 100:

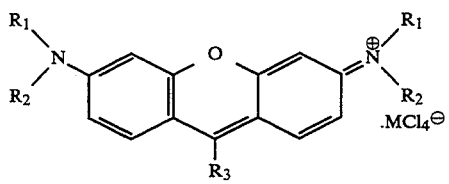

wherein $R_1$ and $R_2$ are selected from the group consisting of H, $CH_3$, and $C_2H_5$, $R_3$ is selected from the group consisting of H, $C_2H_4COOH$, $C_6H_4(COOH)$ which is shown in chemical formula 101, $C_6H_4(COOC_2H_5)$ which is shown in chemical formula 102:

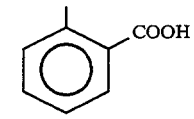
[chemical formula 101]

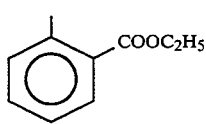
[chemical formula 102]

and M is selected from the group consisting of gallium, indium, and thallium.

A diamine derivative may be used for the organic hole transport layer.

The diamine derivative may be a diamine derivative shown in chemical formula 103, and a Rhodamine metal complex may be selected from the group consisting of chemical formulas 104, 105, 106 and 107:

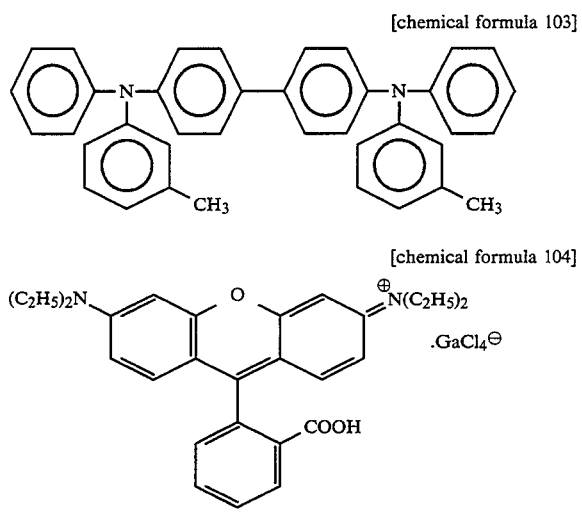
[chemical formula 103]

[chemical formula 104]

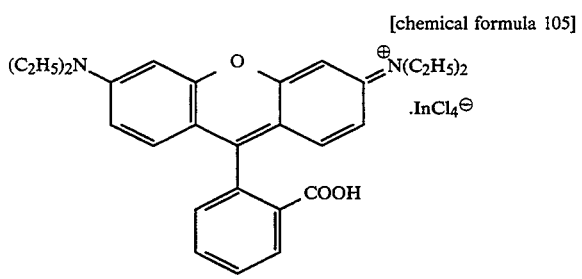
[chemical formula 105]

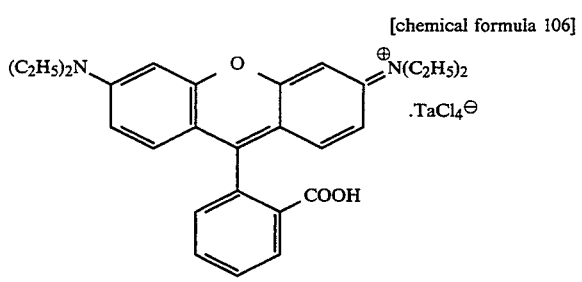
[chemical formula 106]

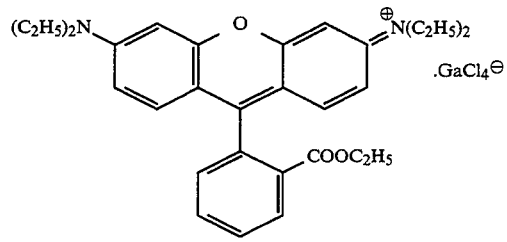
[chemical formula 107]

The organic luminous layer may comprise a chromone metal complex, and the organic hole transport layer may comprise an organic compound that has larger exciton energy than the chromone metal complex.

A metal of the chromone metal complex may be either beryllium or scandium.

A ligand of the chromone metal complex may be a 5-hydroxychromone derivative.

The chromone metal complex may be a compound shown in chemical formula 108:

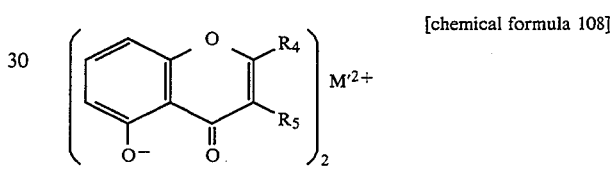
[chemical formula 108]

wherein $R_4$ and $R_5$ are selected from the group consisting of $CH_3$, $C_2H_5$, H, and $C_6H_5$ which is shown in chemical formula 109, and M' is zinc.

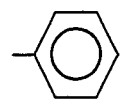
[chemical formula 109]

Polyvinylcarbazole may be used for the organic hole transport layer.

The chromone metal complex is selected from the group consisting of chemical formulas 110, 111, and 112:

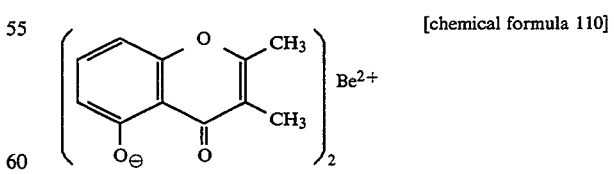
[chemical formula 110]

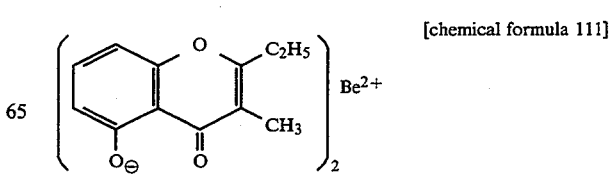
[chemical formula 111]

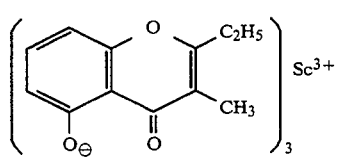
[chemical formula 112]

The organic luminous layer may comprise an azomethine metal complex.

The electron transport layer may comprise an organic compound that has larger exciton energy than the azomethine metal complex.

A metal of the azomethine metal complex may be selected from either the II group or the III group in the periodic table.

The azomethine metal complex may be selected from the group consisting of a compound shown in chemical formula 113, another compound shown in chemical formula 114, an azomethine metal complex whose ligand is an azomethine compound composed of an amino acid, amine, and a salicylaldehyde derivative, and another azomethine metal complex whose ligand is an azomethine compound composed of an amino acid, amine, and a 2-hydroxy-1-naphthaldehyde derivative:

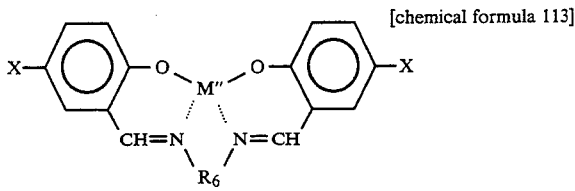
[chemical formula 113]

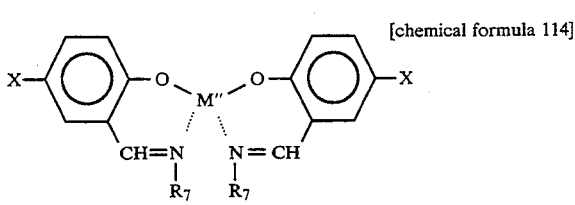
[chemical formula 114]

wherein $R_6$ is selected from the group consisting of $C_nH_{2n}$ (n is an integer from 0 to 20 inclusive), $C_6H_4$ which is shown in chemical formula 115, and $C_{10}H_6$ which is shown in chemical formula 116:

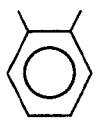
[chemical formula 115]

[chemical formula 116]

wherein $R_7$ is selected from the group consisting of $C_nH_{2n+1}$ (n is an integer from 0 to 10 inclusive), $C_6H_5$ which is shown in chemical formula 117, and $CH_2(C_6H_5)$ which is shown in chemical formula 118:

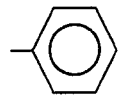
[chemical formula 117]

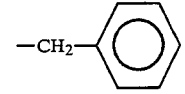
[chemical formula 118]

wherein X is selected from the group consisting of $C_nH_{2n+1}$ (n is an integer from 0 to 10 inclusive), CN, N(CH$_3$)$_2$, NH$_2$, H, halogen, OH, OCH$_3$, and M'' is one of zinc and beryllium.

The organic hole transport layer may comprise a diamine derivative.

The diamine derivative may be a diamine derivative shown in chemical formula 119, and the azomethine metal complex used for the organic luminous layer may be selected from the group consisting of chemical formulas 120, 121, 122, 123, and 124.

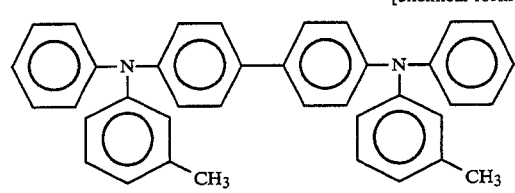
[chemical formula 119]

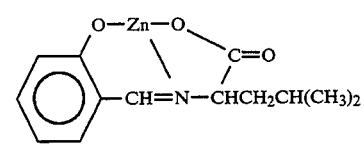
[chemical formula 120]

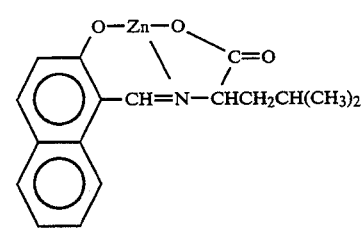
[chemical formula 121]

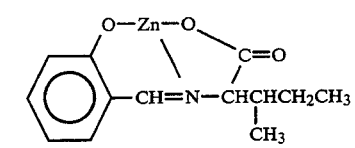
[chemical formula 122]

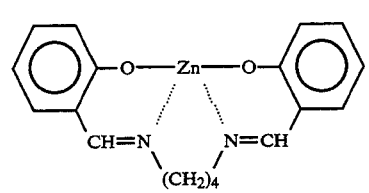
[chemical formula 123]

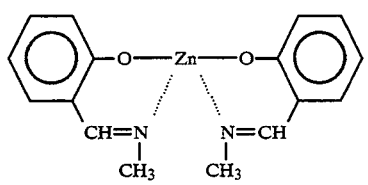
[chemical formula 124]

The organic luminous layer may comprise an azomethine metal complex as a base material, and a compound as a dopant, the compound being different from the compound used as the base material.

A metal of the azomethine metal complex may belong to the group II in the periodic table.

The azomethine metal complex may be one of the compounds shown in chemical formulas 125 and 126:

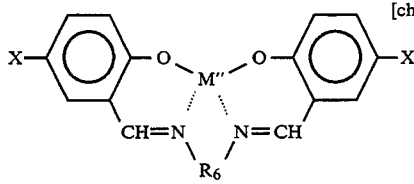
[chemical formula 125]

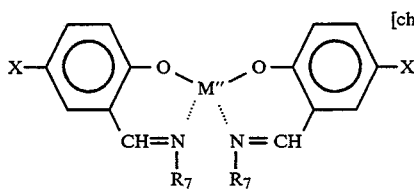
[chemical formula 126]

wherein $R_6$ is selected from the group consisting of $C_nH_{2n}$ (n is an integer from 0 to 20 inclusive), $C_6H_4$ which is shown in chemical formula 127, and $C_{10}H_6$ which is shown in chemical formula 128:

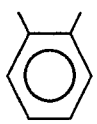
[chemical formula 127]

[chemical formula 128]

wherein $R_7$ is selected from the group consisting of $C_nH_{2n+1}$ (n is an integer from 0 to 10 inclusive), $C_6H_5$ which is shown in chemical formula 129, and $CH_2(C_6H_5)$ which is shown in chemical formula 130:

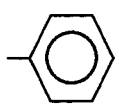
[chemical formula 129]

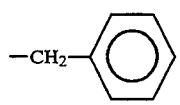
[chemical formula 130]

wherein X is selected from the group consisting of $C_nH_{2n+1}$ (n is an integer from 0 to 10 inclusive), CN, $N(CH_3)_2$, $NH_2$, H, halogen, OH, and $OCH_3$, and M" is one of zinc and beryllium.

A diamine derivative may be used for the organic hole transport layer.

The diamine derivative may be a diamine derivative shown in chemical formula 131, the azomethine metal complex used as the base material may be an azomethine metal complex shown in chemical formula 132, and the compound used as the dopant may be beryllium-8-quinolinol shown in chemical formula 133:

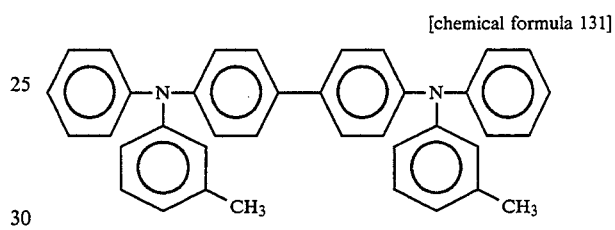
[chemical formula 131]

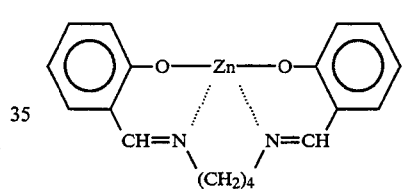
[chemical formula 132]

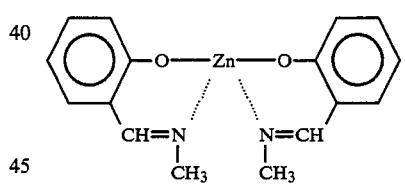

[chemical formula 133]

The organic luminous layer may comprise an azomethine metal complex as a dopant and a compound as a base material, the compound being different from the compound used as the dopant.

A metal of the azomethine metal complex may belong to the group II in the periodic table.

The azomethine metal complex may be one of the compounds shown in chemical formulas 134 and 135:

[chemical formula 134]

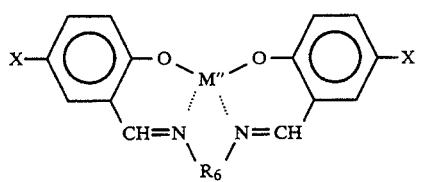

[chemical formula 135]

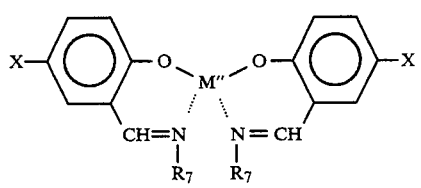

wherein $R_6$ is selected from the group consisting of $C_nH_{2n}$ (n is an integer from 0 to 20 inclusive), $C_6H_4$ which is shown in chemical formula 136, and $C_{10}H_6$ which is shown in chemical formula 137:

[chemicla formula 136]

[chemical formula 137]

wherein $R_7$ is selected from the group consisting of $C_nH_{2n+1}$ (n is an integer from 0 to 10 inclusive), $C_6H_5$ which is shown in chemical formula 138, and $CH_2(C_6H_5)$ which is shown in chemical formula 139:

[chemical formula 138]

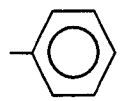

[chemical formula 139]

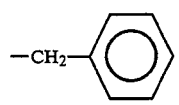

wherein X is selected from the group consisting of $C_nH_{2n+1}$ (n is an integer from 0 to 10 inclusive), CN, $N(CH_3)_2$, $NH_2$, H, halogen, OH, and $OCH_3$, and M'' is one of zinc and beryllium.

There may be two layers between the electrodes, one being an organic luminous layer, the other being an organic electron transport layer, and the organic electron transport layer may be provided between the organic luminous layer and the electron injection electrode.

The organic luminous layer may comprise an azomethine metal complex.

The electron transport layer may comprise an organic compound that has larger exciton energy than the azomethine metal complex.

A metal of the azomethine metal complex may be selected from either the II group or the III group in the periodic table.

The azomethine metal complex may be selected from the group consisting of a compound shown in chemical formula 113, another compound shown in chemical formula 114, an azomethine metal complex whose ligand is an azomethine compound composed of an amino acid, amine, and a salicylaldehyde derivative, and another azomethine metal complex whose ligand is an azomethine compound composed of an amino acid, amine, and a 2-hydroxy-1-naphthaldehyde derivative

[chemical formula 140]

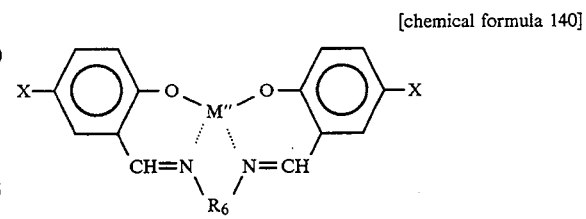

[chemical formula 141]

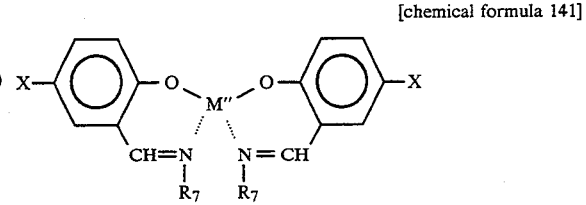

wherein $R_6$ is selected from the group consisting of $C_{n2n}$ (n is an integer from 0 to 20 inclusive), $C_6H_4$ which is shown in chemical formula 142, and $C_{10}H_6$ which is shown in chemical formula 143:

[chemical formula 142]

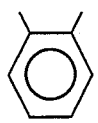

[chemical formula 143]

wherein $R_7$ is selected from the group consisting of $C_nH_{2n+1}$ (n is an integer from 0 to 10 inclusive), $C_6H_5$ which is shown in chemical formula 144, and $CH_2(C_6H_5)$ which is shown in chemical formula 145:

[chemical formula 144]

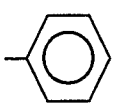

[chemical formula 145]

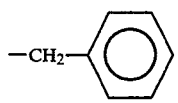

wherein X is selected from the group consisting of $C_nH_{2n+1}$ (n is an integer from 0 to 10 inclusive), CN, $N(CH_3)_2$, $NH_2$, H, halogen, OH, $OCH_3$, and M" is one of zinc and beryllium.

The organic luminous layer may comprise an azomethine metal complex as a base material, and a compound as a dopant, the compound being different from the compound used as the base material.

A metal of the azomethine metal complex may belong to the group II in the periodic table.

The azomethine metal complex may be one of the compounds shown in chemical formulas 146 and 147:

[chemical formula 146]

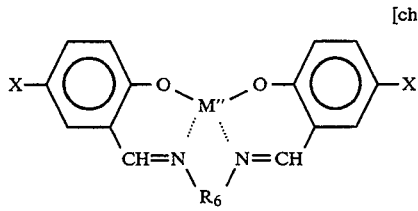

[chemical formula 147]

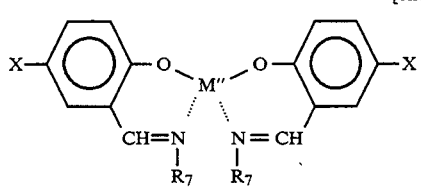

wherein $R_6$ is selected from the group consisting of $C_nH_{2n}$ (n is an integer from 0 to 20 inclusive), $C_6H_4$ which is shown in chemical formula 148, and $C_{10}H_6$ which is shown in chemical formula 149:

[chemical formula 148]

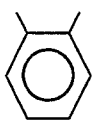

[chemical formula 149]

wherein $R_7$ is selected from the group consisting of $C_nH_{2n+1}$ (n is an integer from 0 to 10 inclusive), $C_6H_5$ which is shown in chemical formula 150, and $CH_2(C_6H_5)$ which is shown in chemical formula 151:

[chemical formula 150]

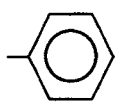

[chemical formula 151]

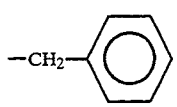

wherein X is selected from the group consisting of $C_nH_{2n+1}$ (n is an integer from 0 to 10 inclusive), CN, $N(CH_3)_2$, $NH_2$, H, halogen, OH, and $OCH_3$, and M" is one of zinc and beryllium.

The organic luminous layer may comprise an azomethine metal complex as a dopant and a compound as a base material, the compound being different from the compound used as the dopant.

A metal of the azomethine metal complex may belong to the group II in the periodic table.

The azomethine metal complex may be one of the compounds shown in chemical formulas 152 and 153:

[chemical formula 152]

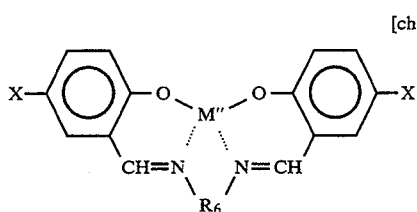

[chemical formula 153]

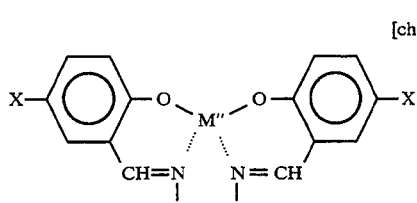

wherein $R_6$ is selected from the group consisting of $C_nH_{2n}$ (n is an integer from 0 to 20 inclusive), $C_6H_4$ which is shown in chemical formula 154, and $C_{10}H_6$ which is shown in chemical formula 155:

[chemical formula 154]

[chemical formula 155]

wherein $R_7$ is selected from the group consisting of $C_nH_{2n+1}$ (n is an integer from 0 to 10 inclusive), $C_6H_5$ which is shown in chemical formula 156, and $CH_2(C_6H_5)$ which is shown in chemical formula 157:

[chemical formula 156]

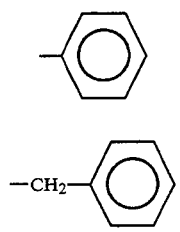

[chemical formula 157]

—CH$_2$— 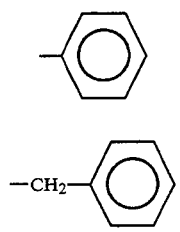

wherein X is selected from the group consisting of C$_n$H$_{2n+1}$ (N is an integer from 0 to 10 inclusive), CN, N(CH$_3$)$_2$, NH$_2$, H, halogen, OH, and OCH$_3$, and M" is one of zinc and beryllium.

The organic electron transport layer may comprise an azomethine metal complex, and the organic luminous layer may comprise an organic compound that has less exciton energy than the azomethine metal complex.

A metal of the azomethine metal complex may belong to the group II in the periodic table.

The azomethine metal complex may be one of the compounds shown in chemical formulas 158 and 159:

[chemical formula 158]

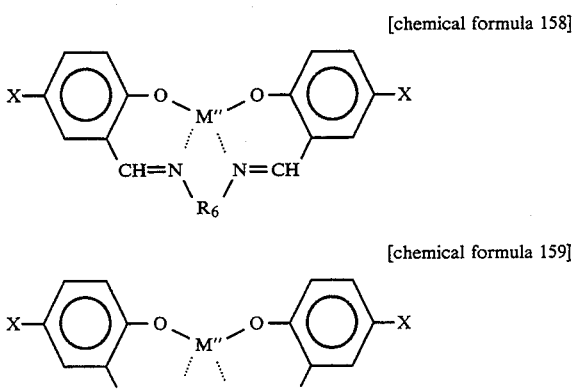

[chemical formula 159]

wherein R$_6$ is selected from the group consisting of C$_n$H$_{2n}$ (n is an integer from 0 to 20 inclusive), C$_6$H$_4$ which is shown in chemical formula 160, and C$_{10}$H$_6$ which is shown in chemical formula 161:

[chemical formula 160]

[chemical formula 161]

wherein R$_7$ is selected from the group consisting of C$_n$H$_{2n+1}$ (n is an integer from 0 to 10 inclusive), C$_6$H$_5$ which is shown in chemical formula 162, and CH$_2$(C$_6$H$_5$) which is shown in chemical formula 163:

[chemical formula 162]

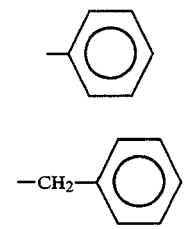

[chemical formula 163]

—CH$_2$— 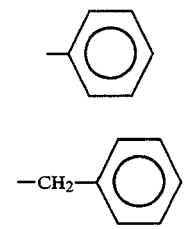

wherein X is selected from the group consisting of C$_n$H$_{2n+1}$ (n is an integer from 0 to 10 inclusive), CN, N(CH$_3$)$_2$, NH$_2$, H, halogen, OH, and OCH$_3$, and M" is one of zinc and beryllium.

There may be three layers between the electrodes, one being an organic luminous layer, another being an organic electron transport layer, the other being an organic hole transport layer, the organic electron transport layer may be provided between the organic luminous layer and the electron injection electrode, and the organic hole transport layer may be provided between the organic luminous layer and the hole injection layer.

The organic luminous layer may comprise a Rhodamine metal complex, the organic electron transport layer may comprise an organic compound that has larger exciton energy than the Rhodamine metal complex, and the organic hole transport layer may comprise an organic compound that has larger exciton energy than the Rhodamine metal complex.

A metal of the Rhodamine metal complex may belong to the group III in the periodic table. The Rhodamine metal complex may comprise a compound shown in chemical formula 164:

[chemical formula 164]

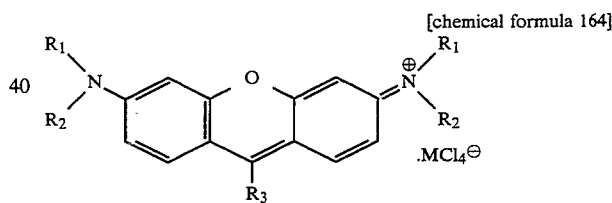

wherein R$_1$ and R$_2$ are selected from the group consisting of H, CH$_3$, and C$_2$H$_5$, R$_3$ is selected from the group consisting of H, C$_2$H$_4$COOH, C$_6$H$_4$(COOH) which is shown in chemical formula 165, and C$_6$H$_4$(COOC$_2$H$_5$) which is shown in chemical formula 166:

[chemical formula 165]

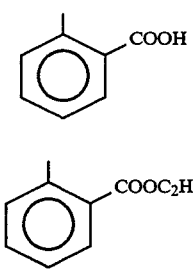COOH

[chemical formula 166]

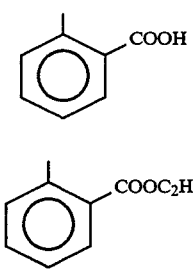COOC$_2$H$_5$ and M is selected from the group consisting of gallium, indium, and thallium.

The organic luminous layer may comprise a chromone metal complex, the organic electron transport layer may comprise an organic compound that has larger exciton energy than the chromone metal complex, and the organic hole transport layer may comprise an organic compound that has larger exciton energy than the chromone metal complex.

A metal of chromone metal complex is either beryllium or scandium.

A ligand of the chromone metal complex may be a 5-hydroxychromone derivative.

The organic luminous layer may comprise an azomethine metal complex.

The electron transport layer may comprise an organic compound that has larger exciton energy than the azomethine metal complex.

A metal of the azomethine metal complex may be selected from either the II group or the III group in the periodic table.

The azomethine metal complex may be selected from the group consisting of a compound shown in chemical formula 113, another compound shown in chemical formula 114, an azomethine metal complex whose ligand is an azomethine compound composed of an amino acid, amine, and a salicylaldehyde derivative, and another azomethine metal complex whose ligand is an azomethine compound composed of an of amino acid, amine, and a 2-hydroxy-1-naphthaldehyde derivative

[chemical formula 167]

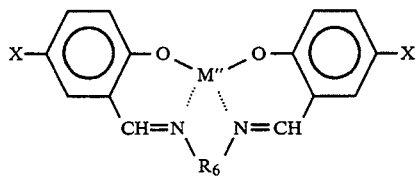

[chemical formula 168]

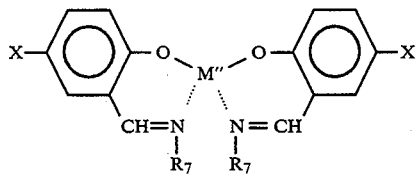

wherein $R_6$ is selected from the group consisting of $C_nH_{2n}$ (n is an integer from 0 to 20 inclusive), $C_6H_4$ which is shown in chemical formula 169, and $C_{10}H_6$ which is shown in chemical formula 170:

[chemical formula 169]

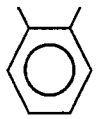

[chemical formula 170]

wherein $R_7$ is selected from the group consisting of $C_nH_{2n+1}$ (n is an integer from 0 to 10 inclusive), $C_6H_5$ which is shown in chemical formula 171, and $CH_2(C_6H_5)$ which is shown in chemical formula 172:

[chemical formula 171]

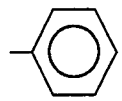

[chemical formula 172]

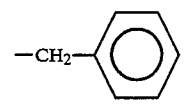

wherein X is selected from the group consisting of $C_nH_{2n+1}$ (n is an integer from 0 to 10 inclusive), CN, N(CH$_3$)$_2$, NH$_2$, H, halogen, OH, and OCH$_3$, and M" is one of zinc and beryllium.

The organic luminous layer may comprise an azomethine metal complex as a base material, and a compound as a dopant, the compound being different from the compound used as the base material.

A metal of the azomethine metal complex may belong to the group II in the periodic table.

The azomethine metal complex may be one of the compounds shown in chemical formulas 173 and 174:

[chemical formula 173]

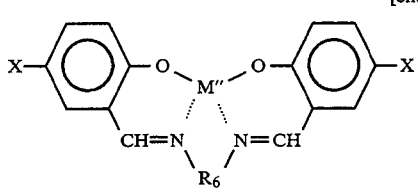

[chemical formula 174]

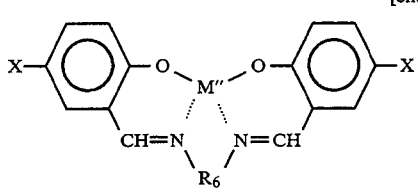

wherein $R_6$ is selected from the group consisting of $C_nH_{2n}$ (n is an integer from 0 to 20 inclusive), $C_6H_4$ which is shown in chemical formula 175, and $C_{10}H_6$ which is shown in chemical formula 176:

[chemical formula 175]

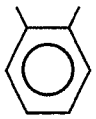

[chemical formula 176]

wherein $R_7$ is selected from the group consisting of $C_nH_{2n+1}$ (n is an integer from 0 to 10 inclusive), C6H5 which is shown in chemical formula 177, and CH2(C6H5) which is shown in chemical formula 178:

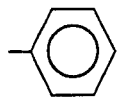
[chemical formula 177]

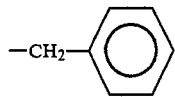
[chemical formula 178]

wherein X is selected from the group consisting of $C_nH_{2n+1}$ (n is an integer from 0 to 10 inclusive), CN, N(CH3)2, NH2, H, halogen, OH, and OCH3, and M″ is one of zinc and beryllium.

The organic luminous layer may comprise an azomethine metal complex as a dopant and a compound as a base material, the compound being different from the compound used as the dopant.

A metal of the azomethine metal complex may belong to the group II in the periodic table.

The azomethine metal complex may be one of the compounds shown in chemical formulas 179 and 180:

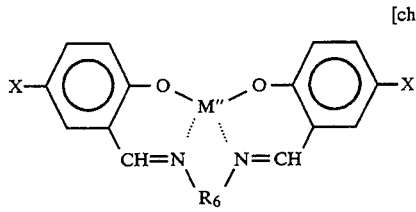
[chemical formula 179]

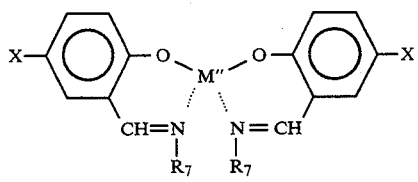
[chemical formula 180]

wherein R6 is selected from the group consisting of $C_nH_{2n}$ (n is an integer from 0 to 20 inclusive), C6H4 which is shown in chemical formula 181, and C10H6 which is shown in chemical formula 182:

[chemical formula 181]

[chemical formula 182]

wherein R7 is selected from the group consisting of $C_nH_{2n+1}$ (n is an integer from 0 to 10 inclusive), C6H5 which is shown in chemical formula 183, and —CH2(C6H5) which is shown in chemical formula 184:

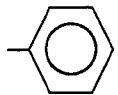
[chemical formula 183]

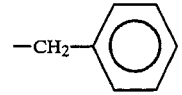
[chemical formula 184]

wherein X is selected from the group consisting of $C_nH_{2n+1}$ (n is an integer from 0 to 10 inclusive), CN, N(CH3)2, NH2, H, halogen, OH, and OCH3, and M″ is one of zinc and beryllium.

The organic electron transport layer may comprise an azomethine metal complex, and the organic luminous layer may comprise an organic compound that has less exciton energy than the azomethine metal complex.

A metal of the azomethine metal complex may belong to the group II in the periodic table.

The azomethine metal complex may be one of the compounds shown in chemical formulas 185 and 186:

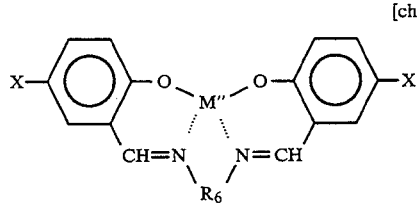
[chemical formula 185]

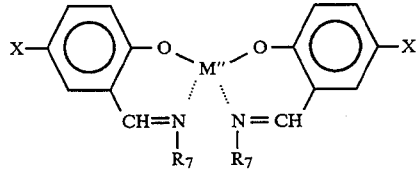
[chemical formula 186]

wherein R5 is selected from the group consisting of $C_nH_{2n}$ (N is an integer from 0 to 20 inclusive), C6H4 which is shown in chemical formula 187, and C10H6 which is shown in chemical formula 188:

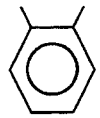
[chemical formula 187]

[chemical formula 188]

wherein R7 is selected from the group consisting of $C_nH_{2n+1}$ (n is an integer from 0 to 10 inclusive), $C_6H_5$ which is shown in chemical formula 189, and $CH_2(C_6H_5)$ which is shown in chemical formula 190:

[chemical formula 189]

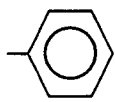

[chemical formula 190]

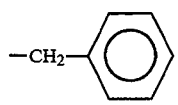

wherein X is selected from the group consisting of $C_nH_{2n+1}$ (n is an integer from 0 to 10 inclusive), CN, $N(CH_3)_2$, $NH_2$, H, halogen, OH, and $OCH_3$, and M" is one of zinc and beryllium.

The organic hole transport layer may comprise a diamine derivative.

The organic luminous layer may comprise phtaloperinone.

The organic electron transport layer may comprise an azomethine metal complex shown in chemical formula 191, and the organic hole transport layer may comprise a diamine derivative shown in chemical formula 192:

[chemical formula 191]

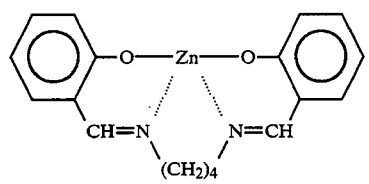

[chemical formula 192]

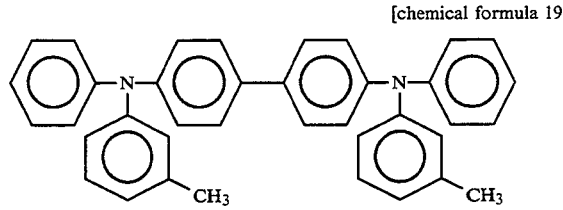

The above-mentioned object can be achieved also by an EL element having an electron injection electrode, a hole injection electrode, and at least one layer therebetween comprising a metal complex whose ligand is selected from the group consisting of thiobromine shown in chemical formula 193, flaviosin shown in chemical formula 194, and acriflavine shown in chemical formula 195:

[chemical formula 193]

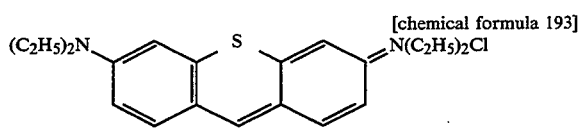

[chemical formula 194]

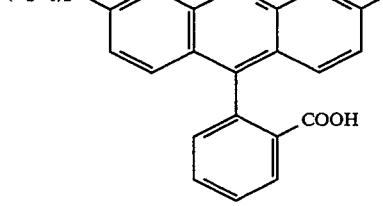

[chemical formula 195]

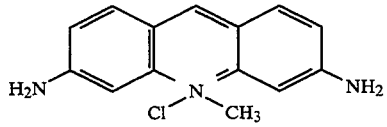

The other object of this invention is to provide a rational method of producing the above-mentioned EL element.

The object can be achieved by a method of producing an EL element having an electron injection electrode, a hole injection electrode, and at least one organic layer therebetween, the method comprising: a first step of forming one of the electrodes onto a glass substrate; a second step of forming the organic layer by vacuum evaporation onto the electrode formed at the first step; and a third step of forming the other electrode by vacuum evaporation onto the organic layer formed at the second step.

There may be two organic layers between the electrodes, one being an organic hole transport layer, the other being an organic luminous layer, and the organic hole transport layer is disposed between the organic luminous layer and the hole injection electrode.

An azomethine metal complex may be used for the organic luminous layer.

There may be three organic layers between the electrodes, one being an organic luminous layer, another being an organic electron transport layer, the other being an organic hole transport layer, the organic electron transport layer is provided between the organic luminous layer and the electron injection electrode, and the organic hole transport layer between the organic luminous layer and the hole injection electrode.

An azomethine metal complex may be used for the organic luminous layer.

Generally, complexes have good film-forming properties, and thin films made therefrom cause few precipitates. Of these complexes, Rhodamine metal complexes, chromone metal complexes, and azomethine metal complexes can exhibit luminescence even when used in solid state.

Therefore, an EL element having good durability and retaining stable luminescence can be produced by using either a Rhodamine metal complex, a chromone metal complex, or an azomethine metal complex for the organic luminous layer, and an azomethine metal complex for the electron transport layer.

When an azomethine metal complex is used as a base material of the organic luminous layer, 1 to 5%, by weight, of a dopant is generally added thereto. Being so little and evenly dispersed in the base material, the dopant itself hardly precipitates.

Such EL elements whose organic luminous layers are produced in doping can exhibit higher luminance with higher efficiency than those produced in other methods.

Accordingly, the former can manage with lower voltage and current to produce luminescence, avoiding both dielectric breakdown caused by a high electric field and heat produced during the exhibition.

Such EL elements having organic luminous layers produced in doping seem to have the following luminescence mechanism.

First, electrons injected from an electrode and holes injected from another are combined with each other inside a compound used as a base material, and as a consequence, produce excitons thereof. Then, energy is transferred from the base material thus excited to a dopant. The dopant thus excited exhibits luminescence to return to the grounding state.

BRIEF DESCRIPTION OF THE DRAWINGS

These and other objects, advantages and features of the invention will become apparent from the following description thereof taken in conjunction with the accompanying drawings which illustrate an specific embodiment of the invention. In the drawings.

DESCRIPTION OF THE PREFERRED EMBODIMENTS

Rhodamine Metal Complex

<Embodiment 1>

Figure 1:
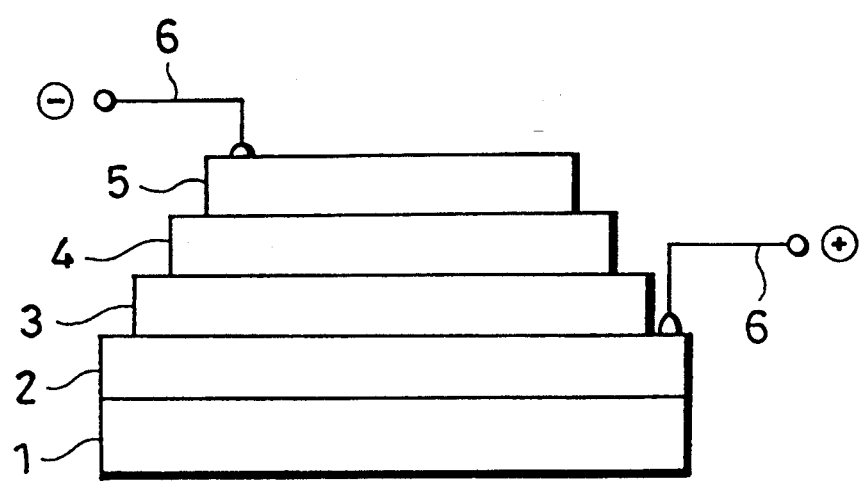
FIG. 1 is a sectional view of the EL element of an embodiment of this invention.

As shown in FIG. 1, the EL element of Embodiment 1 of this invention comprises a transparent hole injection electrode 2 (thickness: 1000 Å) layered on a transparent glass substrate 1, a light transmittable organic hole transport layer 3 (thickness: 500 Å) layered thereon, an organic luminous layer 4 (thickness: 500 Å) further layered thereon, and an electron injection electrode 5 (thickness: 2000 Å) finally layered thereon.

The hole injection electrode 2 and the electron injection electrode 5 are each connected with a lead 6 so that they can be applied voltage.

An In-Sn oxide (ITO) is used for the hole injection electrode 2, a diamine derivative shown in chemical formula 1 for the organic hole transport layer 3, a Rhodamine B-gallium complex shown in chemical formula 2 for the organic luminous layer 4, and an Mg—Ag alloy in the ratio of 10:1 for the electron injection electrode (cathode) 5.

[chemical formula 1]

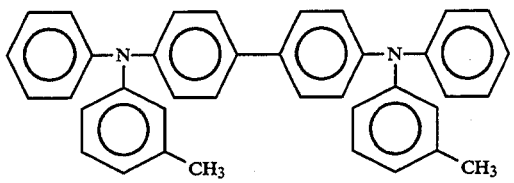

[chemical formula 2]

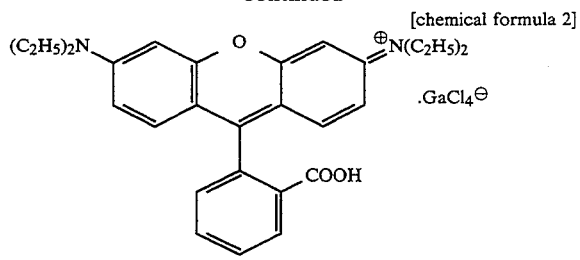

The EL element having the above-mentioned construction was produced as follows.

First, the glass substrate 1 having the hole injection electrode 2 thereon was cleaned with a neutral detergent and ultrasonic cleaned in acetone for 20 minutes and in ethanol for another 20 minutes. Next, the substrate was kept in boiling ethanol for about 1 minute, then taken out, and immediately air dried. Then, the diamine derivative shown in chemical formula 1 was vacuum evaporated onto the hole injection electrode 2 to form the organic hole transport layer 3. Then, the Rhodamine B-gallium complex shown in chemical formula 2, which had been synthesized as described later was vacuum evaporated onto the organic hole transport layer 3 to form the organic luminous layer 4. Finally, Mg and Ag in the ratio of 10:1 were vacuum evaporated onto the organic luminous layer 4 to form the electron injection electrode 5. These evaporations were all conducted under the conditions of $1 \times 10^{-6}$ Torr of vacuum, no restrictions of the substrate temperature, and 2 Å/sec of evaporating speed for the organic layers.

The Rhodamine B-gallium complex used for the organic luminous layer 4 was produced through the following process of synthesis.

1. The synthesis of a Rhodamine metal complex

First, 1 g of commercially available Rhodamine B (Tokyo Chemical Industry) was dissolved in warm water to produce 80 ml of a Rhodamine B aqueous solution. Then, 0.4 g of gallium chloride was dissolved in 6N-hydrochloric acid and the Rhodamine B aqueous solution was added thereinto with stirring in room temperature to produce a Rhodamine metal complex. After abstracted with benzene, the Rhodamine metal complex was condensed to produce a Rhodamine B-gallium complex. This process is shown in chemical formula 3.

[chemical formula 3]

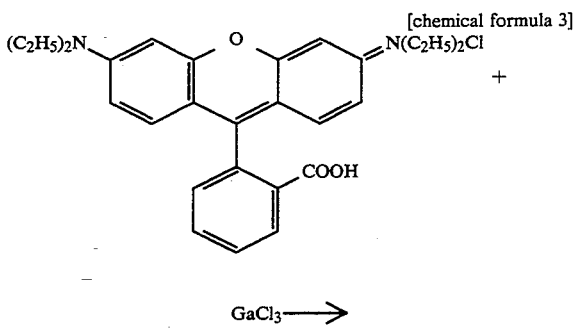

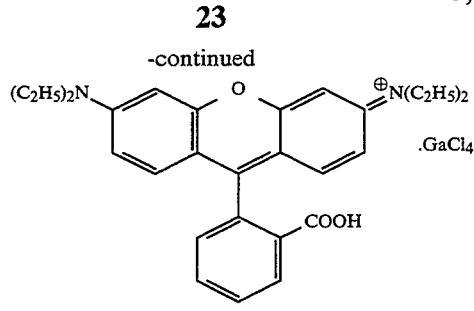

The EL element produced in this embodiment is hereinafter referred to as $A_1$ element.

<Embodiment 2>

The EL element of this embodiment was produced in the same manner as Embodiment 1 except that a Rhodamine B-indium complex shown in chemical formula 4 was used for the organic luminous layer 4 in place of the Rhodamine B-gallium complex.

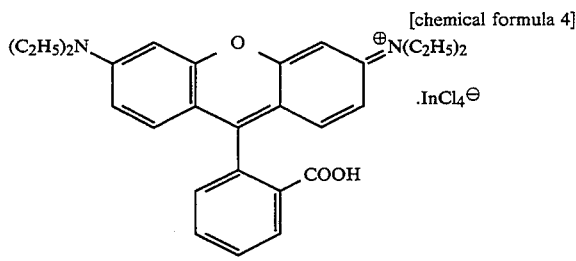

The synthesis of this Rhodamine B-indium complex was conducted in the same manner as Embodiment 1 except that trihydric indium chloride was used in place of gallium chloride.

The EL element produced in this embodiment is hereinafter referred to as $A_2$ element.

<Embodiment 3>

The EL element of this embodiment was produced in the same manner as Embodiment 1 except that a Rhodamine B-thallium complex shown in chemical formula 5 was used for the organic luminous layer 4 in place of the Rhodamine B-gallium complex.

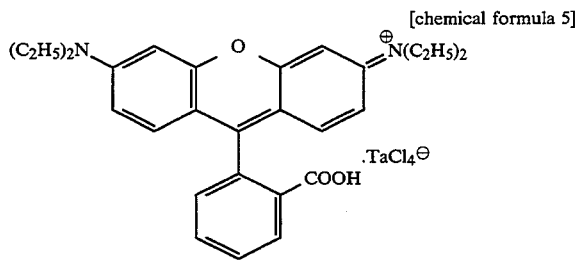

The synthesis of this Rhodamine B-thallium complex was conducted in the same manner as Embodiment 1 except that thallium chloride was used in place of gallium chloride.

The EL element produced in this embodiment is hereinafter referred to as $A_3$ element.

<Embodiment 4>

The EL element of this embodiment was produced in the same manner as Embodiment 1 except that a Rhodamine 3B-gallium complex shown in chemical formula 6 was used for the organic luminous layer 4 in place of the Rhodamine B-gallium complex.

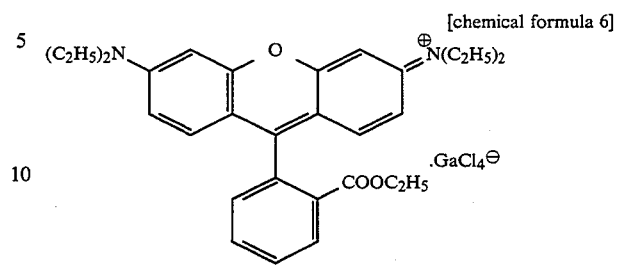

The synthesis of this Rhodamine 3B-gallium complex was conducted in the same manner as Embodiment 1 except that Rhodamine 3B shown in chemical formula 7 was used in place of Rhodamine B, and trihydric gallium chloride in place of gallium chloride.

TABLE 10

| Sample No. | Composition | Porosity (%) | Dimensional shrinkage rate (%) | | | |
|---|---|---|---|---|---|---|
| | | | 10 cycles | 20 cycles | 40 cycles | 100 cycles |
| 3-1 | $La_{0.9}Sr_{0.1}MnO_3$ | 26.4 | 0.25 | — | — | — |
| 3-2 | $La_{0.8}Sr_{0.2}MnO_3$ | 19.8 | 0.09 | 0.14 | 0.25 | 0.51 |
| 3-3 | $La_{0.75}Sr_{0.25}MnO_3$ | 34.1 | 0.01 | 0.01 | 0.01 | 0.01 |
| 3-4 | $La_{0.9}Ca_{0.1}MnO_3$ | 37.0 | 0.15 | — | — | — |
| 3-5 | $La_{0.8}Ca_{0.2}MnO_3$ | 28.5 | 0.29 | 0.56 | 1.10 | 2.42 |
| 3-6 | $La_{0.75}Ca_{0.25}MnO_3$ | 21.3 | 0.10 | 0.16 | 0.28 | 0.59 |
| 3-7 | $La_{0.7}Ca_{0.3}MnO_3$ | 40.9 | 0.00 | 0.00 | 0.01 | 0.01 |

The EL element produced in this embodiment is hereinafter referred to as $A_4$ element.

Comparative Example 1

An EL element was produced in the same manner as Embodiment 1 except that a perylene derivative shown in chemical formula 8 was used for the organic luminous layer 4 in place of the Rhodamine B-Gallium complex.

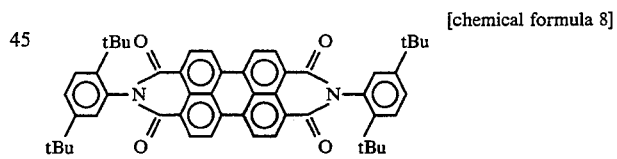

(Experiment)

The luminance, EL peak wavelength, and durability of each of the EL elements $A_1$ through $A_4$ and the comparative example 1 were measured by impressing a positive bias on the hole injection electrode 2 and a negative bias on the electron injection electrode 5. The results are shown in Table 1.

TABLE 1

| elements | EL wave length (nm) | luminance (cd/m²) | voltage (V) | current density (mA/cm²) | luminous color | durability |
|---|---|---|---|---|---|---|
| $A_1$ | 585 | 500 | 17 | 130 | orange-red | 3 days |
| $A_2$ | 585 | 380 | 17 | 120 | orange-red | 2 days |
| $A_3$ | 585 | 250 | 17 | 130 | orange-red | 2 days |
| $A_4$ | 583 | 200 | 16 | 120 | red | 30 hr. |
| c.f. 1 | 630 | 100 | 17 | 125 | red | 25 hr. |

As apparent from Table 1, it was confirmed that the EL elements $A_1$ through $A_4$ had all excellent durability, which seemed to result from the high quality film-forming characteristics of the complexes.

It was also confirmed that the EL elements $A_1$ through $A_4$ all exhibited the luminous colors of red or orange-red with high luminance.

(Others)

Although Rhodamine B or Rhodamine 3B is used for the Rhodamine metal complexes in the above embodiments, any one of Rhodamine S shown in chemical formula 9, Acridine Red shown in chemical formula 10, and other Rhodamine compounds can be used instead to obtain the same effects.

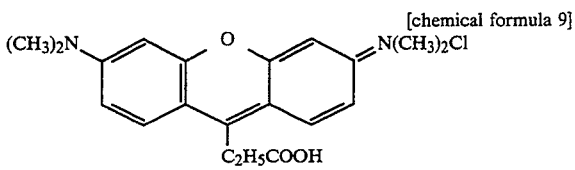

[chemical formula 9]

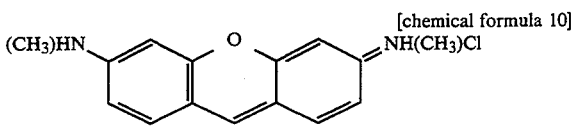

[chemical formula 10]

Furthermore, any one of thiobromine, flaviosin, and acriflavine respectively shown in chemical formulas 11, 12, and 13 can be used instead of the Rhodamine compound.

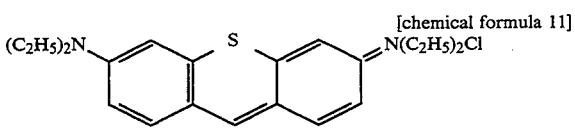

[chemical formula 11]

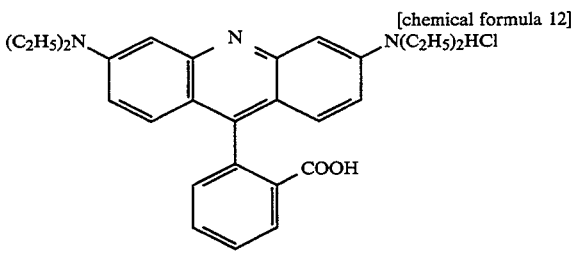

[chemical formula 12]

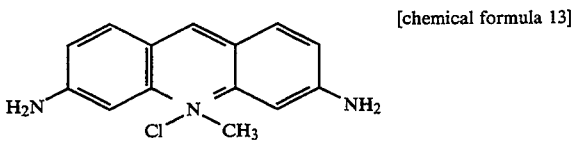

[chemical formula 13]

Although gallium, thallium, and indium are used in the above embodiments, another metal can be used instead.

Although the Rhodamine metal complexes are used for the organic luminous layer only in the SH-A structure of the 2-layer structure in the above embodiments, they can also be used in the 3-layer structure to obtain the same effects.

The glass substrate 1 can be positioned at the other end of the accumulated layers provided that both the electron injection electrode 5 and the organic electron transport layer are light transmittable in the 3-layer structure, and that the electron injection electrode 5 is light transmittable in the SH-A structure.

Chromone Metal Complex

<Embodiment 1>

The EL element of this embodiment was produced in the same manner as Embodiment 1 of Rhodamine Metal Complex with the exceptions that polyvinylcarbazole (PVCz) was used for the organic hole transport layer 3 in place of the diamine derivative, a 2,3-dimethyl-5-hydroxychromone-beryllium complex shown in chemical formula 14 for the organic luminous layer 4 in place of the Rhodamine B-gallium complex, and an Mg—In alloy for the electron injection electrode 5 in place of an Mg—Ag alloy in the ratio of 10:1; the cleaned glass substrate 1 with the hole injection electrode 2 thereon was dried with a fan; and a temperature of the glass substrate during the evaporations was made 20° C.

TABLE 11

| Sample No. | Composition | Porosity (%) | Dimensional shrinkage rate (%/10 cycles) |
|---|---|---|---|
| 3-8 | $La_{0.725}Ca_{0.275}MnO_3$ | 37.5 | 0.03 |
| 3-9 | $La_{0.657}Ca_{0.325}MnO_3$ | 24.9 | 0.00 |
| 3-10 | $La_{0.65}Ca_{0.35}MnO_3$ | 34.0 | 0.01 |
| 3-11 | $La_{0.6}Ca_{0.4}MnO_3$ | 5.1 | 0.00 |
| 3-5 | $La_{0.8}Ca_{0.2}MnO_3$ | 28.5 | 0.29 |
| 3-6 | $La_{0.75}Ca_{0.25}MnO_3$ | 21.3 | 0.10 |
| 3-7 | $La_{0.7}Ca_{0.3}MnO_3$ | 40.9 | 0.00 |

The synthesis of this 2,3-dimethyl-5-hydroxychromoneberyllium complex was conducted as follows.

1. the synthesis of its ligands

First, 15 g of 2,6-dihydroxypropiophenone and 15 g of well dried sodium acetate (anhydrous) were mixed and put in a three neck flask. Then, 30 ml of acetic anhydride was added thereto and they were made to react with each other for 6 hours at 170° C. with stirring. Immediately after the completion of the reaction, it was poured with stirring in the mixture of 500 ml of water and 250 g of ice, and as a consequence, precipitates were observed. After enough decantations with water, the precipitates were filtered and dissolved in 450 ml of ether. Then, it was dehydrated with sodium sulfate anhydride, filtered, and separated from the ether to obtain about 18 g of 2,3-dimethyl-5-acetoxychromone, which was heated for 1 hour in 1800 ml of 10% sodium carbonate solution in an atmosphere of nitrogen gas. Then, after hydrochloride was added thereto to acidify it, it was cooled, and as a consequence, light yellow precipitates were observed. The precipitates were steam distillated to produce 2,3-dimethyl-5-hydroxychromon, which was further crystallized with methanol (yield 30%) to produce the ligands. This process of the synthesis is shown in chemical formula 15.

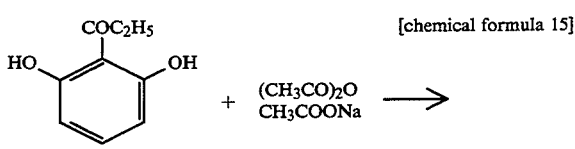

[chemical formula 15]

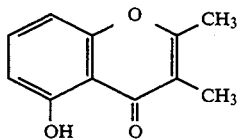

2. the synthesis of the complex

First, 2 g of the above synthesized ligands, 2,3-dimethyl-5-hydroxychromone were dissolved in 30 ml of methanol, and 1.4 g of beryllium sulfate tetrahydrate was dissolved in 30 ml of water, both of which were mixed with stirring. When the pH was adjusted to be 4 or larger, they were reacted with each other, and as a consequence, yellow precipitates were observed. They are the 2,3-dimethyl-5-hydroxychromone-beryllium complexes, which exhibit green fluorescence under ultraviolet rays. This process of the synthesis is shown in chemical formula 16.

[chemical formula 16]

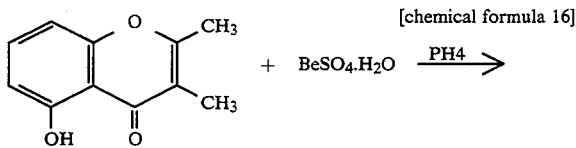

The EL element produced in this embodiment is hereinafter referred to as $B_1$ element.

<Embodiment 2>

The EL element of this embodiment was produced in the same manner as Embodiment 1 of Chromone Metal Complex except that a 2-ethyl-3-methyl-5-hydroxychromone-beryllium complex shown in chemical formula 17 was used for the organic luminous layer in place of the 2,3-dimethyl-5-hydroxychromone-beryllium complex.

[chemical formula 17]

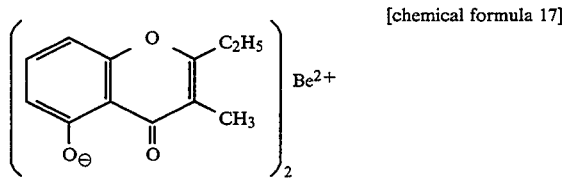

The synthesis of this 2-ethyl-3-methyl-5-hydroxychromone-beryllium complex was conducted in the same manner as Embodiment 1 of Chromone Metal Complex except that the ligands, 2-ethyl-3-methyl-5-hydroxychromone were synthesized by using 15 g of 2,6-dihydroxypropiophenone, 15 g of sodium propionate (anhydrous), and 30 ml of propionic anhydride.

The EL element produced in this embodiment is hereinafter referred to as $B_2$ element.

<Embodiment 3>

The EL element of this embodiment was produced in the same manner as Embodiment 1 of Chromone Metal Complex except that a 2-ethyl-3-methyl-5-hydroxychromone-scandium complex shown in chemical formula 18 was used for the organic luminous layer in place of the 2,3-dimethyl-5-hydroxychromone-beryllium complex.

[chemical formula 18]

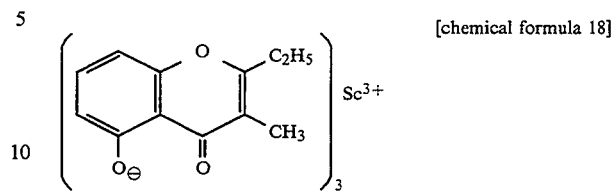

The synthesis of this 2-ethyl-3-methyl-5-hydroxychromone-scandium complex was conducted in the same manner as Embodiment 1 of Chromone Metal Complex except that scandium nitrate was used in place of beryllium sulfate tetrahydrate.

The EL element produced in this embodiment is hereinafter referred to as $B_3$ element.

(Comparative Example 2)

An EL element was produced in the same manner as Embodiment 1 of Chromone Metal Complex except that a Aluminum-5,7-dichloro-8-quinolinol complex shown in chemical formula 19 was used for the organic luminous layer 4 in place of the 2,3-dimethyl-5-hydroxychromone-beryllium complex.

[chemical formula 19]

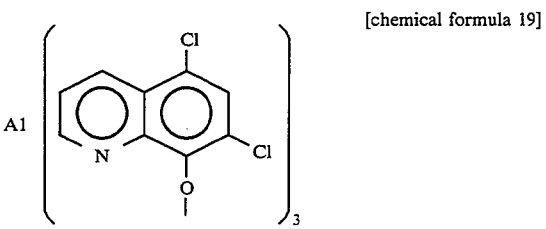

(Experiment)

The luminance, EL peak wavelength, and durability of each of the EL elements $B_1$ through $B_4$ and the comparative example 2 were measured by impressing a positive bias on the hole injection electrode 2 and a negative bias on the electron injection electrode 5. The results are shown in Table 2.

TABLE 2

| elements | EL wave length (nm) | luminance (cd/m$^2$) | voltage (V) | current density (mA/cm$^2$) | luminous color | durability (days) |
|---|---|---|---|---|---|---|
| $B_1$ | 515 | 300 | 18 | 170 | green | 4 |
| $B_2$ | 510 | 350 | 16 | 140 | green | 3 |
| $B_3$ | 520 | 200 | 20 | 180 | green | 4 |
| c.f. 2 | 530 | 150 | 28 | 53 | green | 1 |

As apparent from Table 2, it was confirmed that the elements $B_1$ through $B_3$ had all excellent durability, which seemed to result from the high quality film-forming characteristics of the complexes.

It was also confirmed that the elements $B_1$ through $B_3$ all exhibited the luminous color of green with high luminance.

(Others)

Instead of the above-mentioned ligands, 5-hydroxyflavone or 5-hydroxyisoflavone respectively shown in chemical formulas 20 and 21 can be used to obtain the same effects. They are produced by replacing respectively 2-position or 3-position of 5-hydroxychromone by a phenyl group. Also, a complex having either one of their derivatives as its ligand can be used in the same manner.

[chemical formula 20]

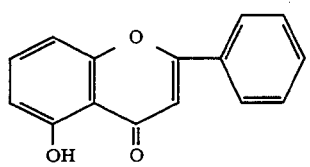

[chemical formula 21]

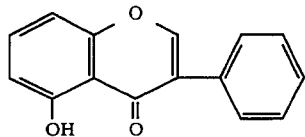

Although the chromone metal complexes are used for the organic luminous layer only the SH-A structure of the 2-layer structure in the above embodiments, they can also be used in the 3-layer structure to obtain the same effects.

The glass substrate 1 can be positioned at the other end of the accumulated layers provided that both the electron injection electrode 5 and the organic electron transport layer are light transmittable in the 3-layer structure, and that the electron injection electrode 5 is light transmittable in the SH-A structure.

Azomethine Metal Complex

<Embodiment 1>

The EL element of this embodiment was produced in the same manner as Embodiment 1 of Rhodamine Metal Complex except that an azomethine-zinc metal complex shown in chemical formula 22 was used for the organic luminous layer 4 in place of the Rhodamine B-gallium complex, an Mg—In alloy for the electron injection electrode 5 in place of an Mg—Ag alloy in the ratio of 10:1, and a temperature of the glass substrate 1 during the evaporations was made 20° C.

[chemical formula 22]

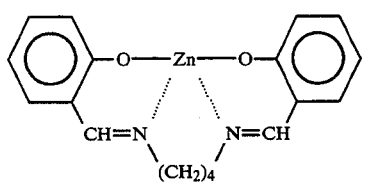

The synthesis of this azomethine-zinc metal complex was conducted as follows.

First, 1.32 g (15 mmol) of 1,4-diaminobutane and 20 ml of methanol were put in a three neck flask (capacity: 300 ml) together, and 3.29 g(30 mmol) of salicylaldehyde was dropped from a dropping funnel in open system at room temperature. As soon as the dropping was started, the mixture was yellow turbid producing precipitates. After the dropping of salicylaldephde was done, 30 ml of methanol with 3.29 g (30 mmol) of zinc acetate dissolved at room temperature therein was dropped from a dropping funnel at room temperature. After the completion of this dropping, the system of reaction was heated to be refluxed for 3.5 hours, and as a consequence, a large number of precipitates were observed. Then, they were suction filtered, dried by heating at 80° C. for 2 hours, and purified with a sublimation apparatus (H. J. Wagner, R. O. Loutfy, and C. K. Hsiao; *J. Mater. Sci.* 172781 (1982)), which employs the train sublimation method. The process of the synthesis is shown in chemical formula 23.

[chemical formula 23]

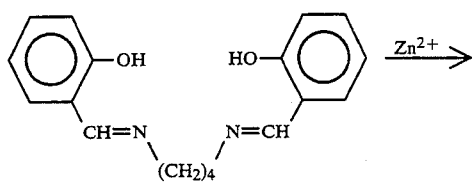

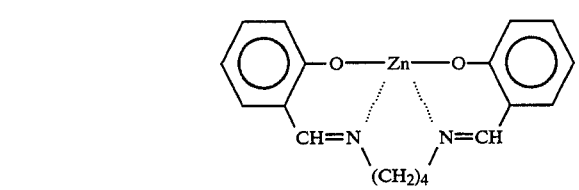

The EL element produced in this embodiment is hereinafter referred to as $C_1$ element.

<Embodiment 2>

The EL element of this embodiment was produced in the same manner as Embodiment 1 of Azomethine Metal Complex except that an azomethine-zinc metal complex shown in chemical formula 24 was used for the organic luminous layer 4 in place of the azomethine-zinc metal complex shown in chemical formula 22.

[chemical formula 24]

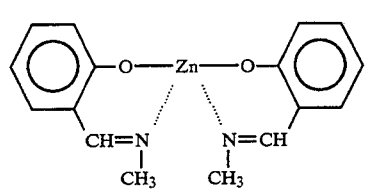

Used in the synthesis of this azomethine-zinc metal complex were salicylaldehyde, a 40% methylamine methanol solution, and zinc acetate. The conditions were the same as Embodiment 1 of Azomethine Metal Complex. The process of the synthesis is shown in chemical formula 25.

[chemical formula 25]

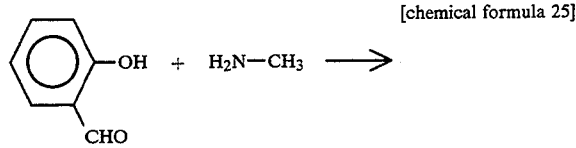

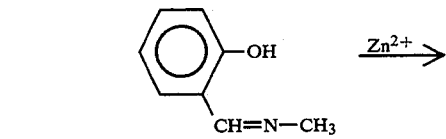

-continued

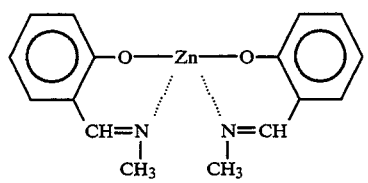

The EL element produced in this embodiment is hereinafter referred to as $C_2$ element.

<Embodiment 3>

The EL element of this embodiment was produced in the same manner as Embodiment 1 of Azomethine Metal Complex except that an azomethine-zinc metal complex shown in chemical formula 26 was used for the organic luminous layer 4 in place of the azomethine-zinc metal complex shown in chemical formula 22 and that the cleaned glass substrate 1 with the hole injection electrode 2 thereon was dried with a fan.

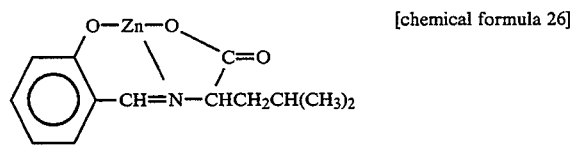

[chemical formula 26]

The synthesis of this axomethine-zinc metal complex are conducted as follows.

First, 2 g (15.25 mmol) of DL-leucine and 0.61 g (15.25 mmol) of sodium hydroxide were put in a three neck flask (capacity: 300 ml) together, and dissolved in 70 ml of methanol at room temperature. Then, 1.86 g (15.25 mmol) of salicylaldehyde was dropped therein from a dropping funnel for about 10 minutes at room temperature. Further, 3.35 g (15.25 mmol) of zinc acetate [$Zn(CH_3COO)_2 2H_2O$] dissolved in 50 ml of methanol was dropped in the system of reaction in the same manner. Then, after 3.5 hours of refluxing, white-yellow precipitates were observed. The precipitates were suction filtered, cleaned by hot methanol, and dried for 1 hour at 70° C. As a result, white powder complexes were obtained. The process of the synthesis is shown in chemical formula 27.

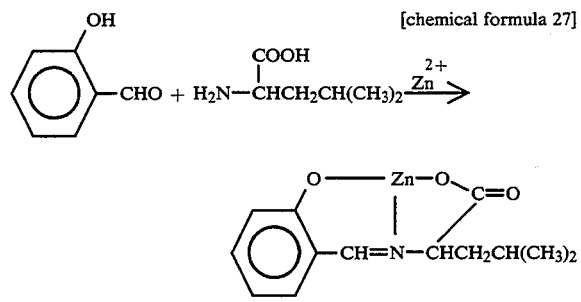

[chemical formula 27]

The EL element produced in this embodiment is hereinafter referred to as $C_3$ element.

<Embodiment 4>

The EL element of this embodiment was produced in the same manner as Embodiment 1 of Azomethine Metal Complex except that an azomethine metal complex shown in chemical formula 28 was used for the organic luminous layer 4 in place of the azomethine metal complex shown in chemical formula 22 and polyvinylcarbazole (PVCz) for the organic hole transport layer 3 in place of the diamine derivative shown in chemical formula 1.

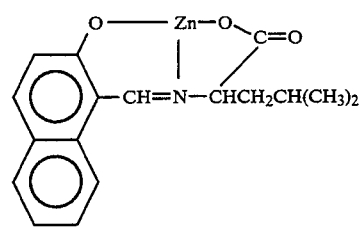

[chemical formula 28]

The synthesis of this azomethine metal complex was conducted under the same conditions as in Embodiment 3 of Azomethine metal complex by using DL-leucine and 2 hydroxy-1-naphthaldehyde shown in chemical formula 29.

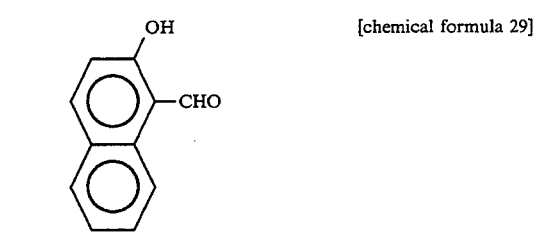

[chemical formula 29]

The EL element produced in this embodiment is hereinafter referred to as $C_4$ element.

<Embodiment 5>

The EL element of this embodiment was produced in the same manner as Embodiment 1 of Azomethine Metal Complex except that an azomethine metal complex shown in chemical formula 30 was used for the organic luminous layer 4 in place of the azomethine-zinc metal complex shown in chemical formula 22.

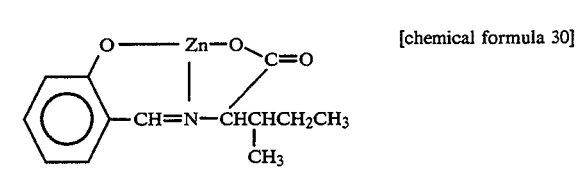

[chemical formula 30]

The synthesis of this azomethine metal complex was conducted under the same conditions as in Embodiment 3 of Azomethine Metal Complex by using both DL-isoleucine shown in chemical formula 31 and salicylaldehyde for its ligands.

[chemical formula 31]

The EL element produced in this embodiment is hereinafter referred to as $C_5$ element.

<Embodiment 6>

The EL element of this embodiment was produced in the same manner as Embodiment 1 of Azomethine Metal Complex except that the organic luminous layer 4 was formed by vacuum evaporation by using the azomethine metal complex shown in chemical formula 22 as a base material and beryllium-8-quinolinol shown in chemical formula 32 as a dopant.

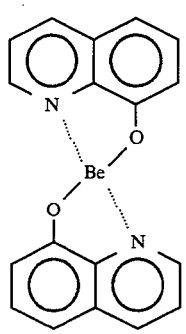

[chemical formula 32]

The EL element produced in this embodiment is hereinafter referred to as $C_6$ element.

<Embodiment 7>

The EL element of this embodiment was produced in the same manner as Embodiment 1 of Azomethine Metal Complex except that an organic electron transport layer was additionally provided between the electron injection electrode 5 and the organic luminous layer 4, and that phtaloperinone shown in chemical formula 33 was used for the organic luminous layer 4 whose thickness was made 100 Å, and the azomethine-zinc metal complex shown in chemical formula 22 for the organic electron transport layer whose thickness was made 400 Å.

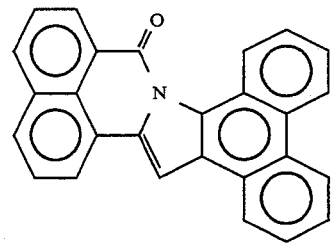

[chemical formula 33]

The EL element produced in this embodiment is hereinafter referred to as $C_7$ element.

Comparative Example 3

An EL element was produced in the same manner as Embodiment 7 of Azomethine Metal Complex except that 1,1,4,4-tetraphenyl-1,3-butadiene shown in chemical formula 34 was used for the organic luminous layer 4 in place of phtaloperinone shown in chemical formula 33, and tBu-PBD shown in chemical formula 35 for the organic electron transport layer in place of the azomethine-zinc metal complex shown in chemical formula 22.

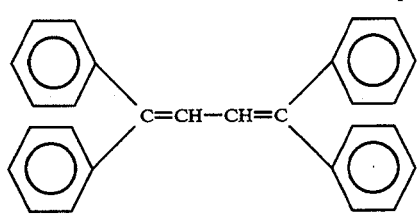

[chemical formula 34]

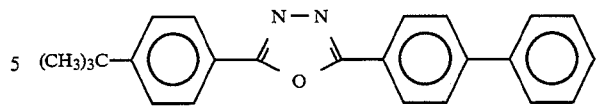

[chemical formula 35]

(Experiment)

The luminance, EL peak wavelength, and durability of each of the EL elements $C_1$ through $C_7$ and the comparative example 3 were measured by impressing a positive bias on the hole injection electrode 2 and a negative bias on the electron injection electrode 5. The results are shown in Table 3.

TABLE 3

| elements | EL wave length (nm) | luminance (cd/m$^2$) | voltage (V) | current density (mA/cm$^2$) | luminous color | durability (days) |
|---|---|---|---|---|---|---|
| $C_1$ | 465 | 1000 | 18 | 191 | blue | 8 |
| $C_2$ | 470 | 700 | 22 | 190 | blue | 6 |
| $C_3$ | broad | 500 | 18 | 180 | white | 3 |
| $C_4$ | broad | 400 | 20 | 200 | white | 3 |
| $C_5$ | broad | 400 | 18 | 170 | bluish-white | 3 |
| $C_6$ | 520 | 3000 | 18 | 150 | green | 9 |
| $C_7$ | 590 | 650 | 20 | 180 | orange | 4 |
| c.f. 3 | 460 | 500 | 12 | 100 | blue | 1 |

As apparent from Table 3, it was confirmed that the EL elements $C_1$ through $C_7$ had all excellent durability, which seemed to result from the high quality film-forming characteristics of the complexes.

It was also confirmed that the luminance of the element $C_6$ resulted not from the azomethine metal complex but from the beryllium-8-quinolinol because its luminous color was green. Hence, the azomethine metal complex has turned out to be a good base material in doping. It was further confirmed that the same element $C_6$ could have been driven with much lower voltage and current because such an element with high luminance could be obtained in doping.

Figure 2:
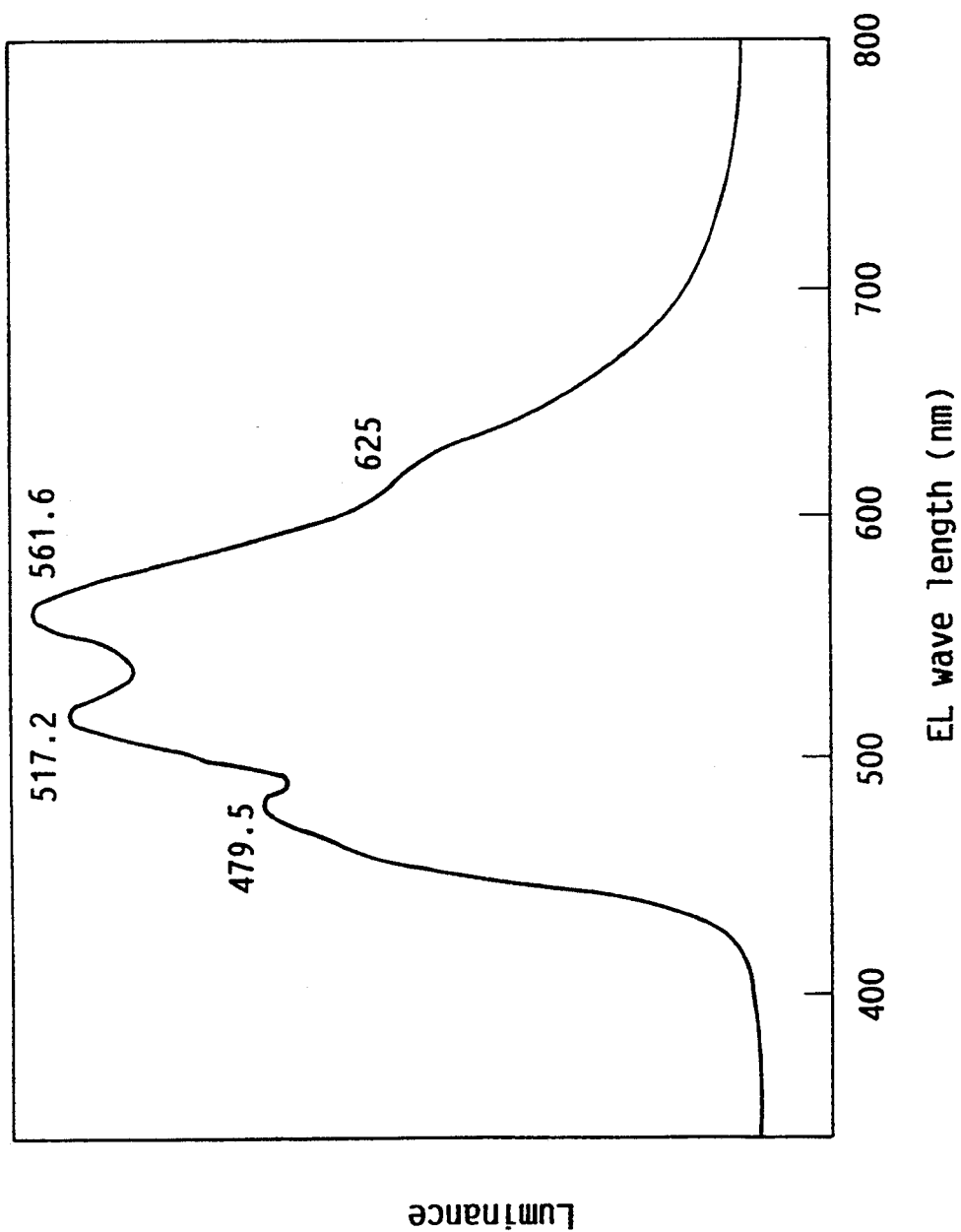
FIG. 2 is the luminous spectral of $C_3$ element.
Figure 3:
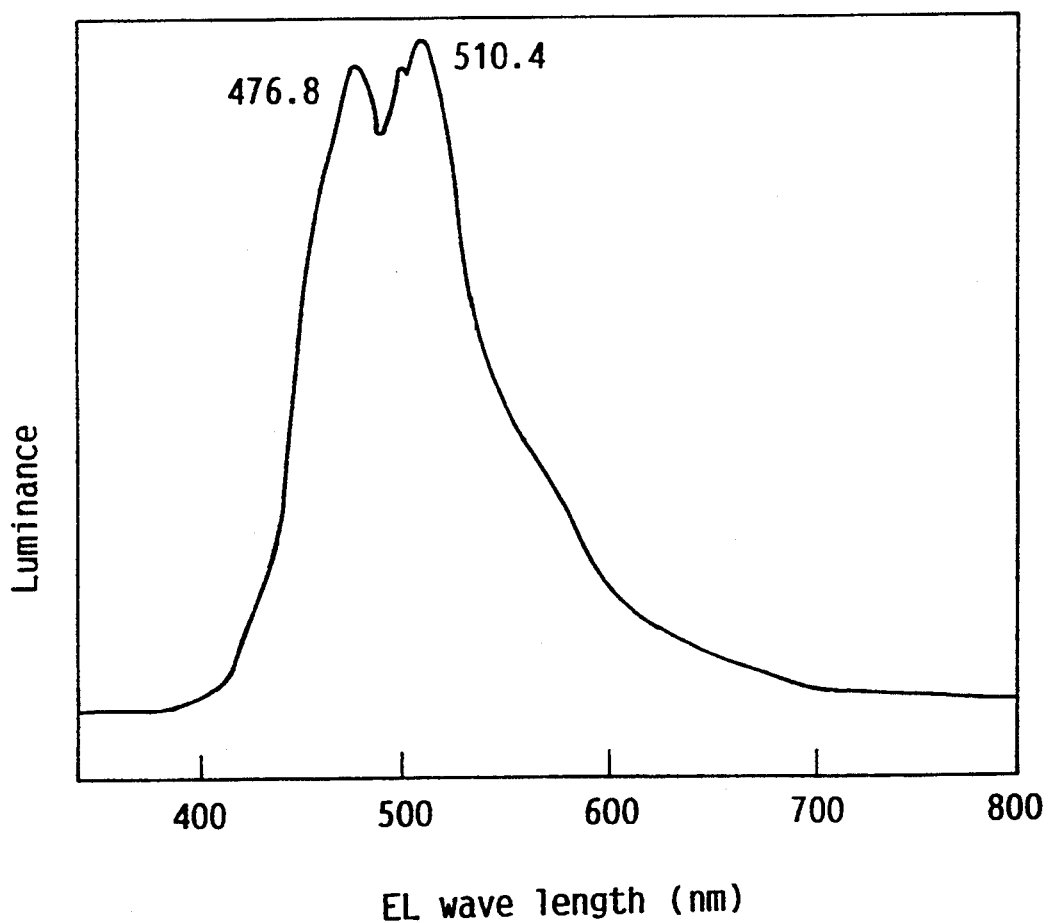
FIG. 3 is the luminous spectral of $C_5$ element.

On the other hand, the EL elements $C_3$ through $C_5$ exhibited the luminous color of white, which could be very useful in industry to realize a flat full-color display by combining with color filters. The spectral of the EL elements $C_3$ and $C_5$ are shown in FIGS. 2 and 3 respectively.

(Others)

(1) Instead of the metals used in the embodiments, magnesium, aluminum, gallium, and indium can be used if an azomethine metal complex is an azomethine metal compound whose ligand is composed of an amino acid, amine, and either a salicylaldehyde derivative or a 2-hydroxy-1-naphthaldehyde derivative.

(2) Although the azomethine metal complexes are used for the organic luminous layer only in the SH-A structure of the 2-layer structure in the above embodiments, they can be used in the SH-B structure or the 3-layer structure to obtain the same effects with the exception that the azomethine metal compound mentioned in (1) above cannot be used for the organic luminous layer of the SH-B structure.

(3) Although the azomethine metal complexes are used as base materials when the organic luminous layers are formed by doping, they can also be used as dopants. However, the azomethine metal compound mentioned in (1) above cannot be used as a base material nor a dopant.

(4) If the azomethine metal complexes described in the above embodiments are used for the organic electron transport layers, they can be used also in the SH-B structure besides the 3-layer structure described in the embodiments. However, the azomethine metal compound mentioned in (1) above cannot be used for the organic electron transport layer.

When an azomethine metal complex is used for the organic luminous layer, the glass substrate 1 can be positioned at the other end of the accumulated layers provided that both the electron injection electrode 5 and the organic electron transport layer are light transmittable in the 3-layer structure or the SH-B structure, and that the electron injection electrode 5 is light transmittable in the SH-A structure.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. An EL element having an electron injection electrode, a hole injection electrode, and at least one layer therebetween, wherein one of said layers is an organic luminous layer comprising one of a Rhodamine metal complex, a chromone metal complex and an azomethine metal complex.

2. An EL element of claim 1, wherein there are two layers between said electrodes, one being an organic luminous layer, the other being an organic hole transport layer, and said organic hole transport layer is provided between said organic luminous layer and said hole injection electrode.

3. An EL element of claim 2, wherein said organic luminous layer comprises said Rhodamine metal complex, and said organic hole transport layer comprises an organic compound that has larger exciton energy than said Rhodamine metal complex.

4. An EL element of claim 3, wherein a metal of said Rhodamine metal complex belongs to the group III in the periodic table.

5. An EL element of claim 4, wherein said Rhodamine metal complex comprises a compound shown in chemical formula 100:

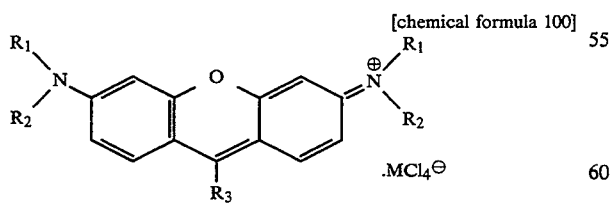

[chemical formula 100]

wherein $R_1$ and $R_2$ are selected from the group consisting of H, $CH_3$, and $C_2H_5$, $R_3$ is selected from the group consisting of H, $C_2H_4COOH$, $C_6H_4(COOH)$ which is shown in chemical formula 101, $C_6H_4(COOC_2H_5)$ which is shown in chemical formula 102:

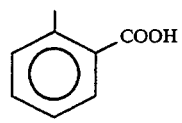

[chemical formula 101]

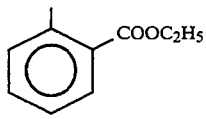

[chemical formula 102]

and M is selected from the group consisting of gallium, indium, and thallium.

6. An EL element of claim 5, wherein a diamine derivative is used for said organic hole transport layer.

7. An EL element of claim 6, wherein said diamine derivative is shown in chemical formula 103, and said Rhodamine metal complex is selected from the group consisting of chemical formulas 104, 105, 106 and 107:

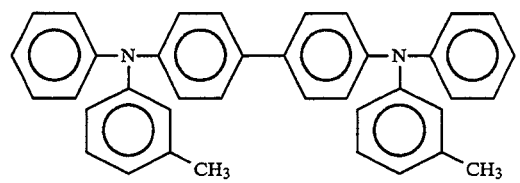

[chemical formula 103]

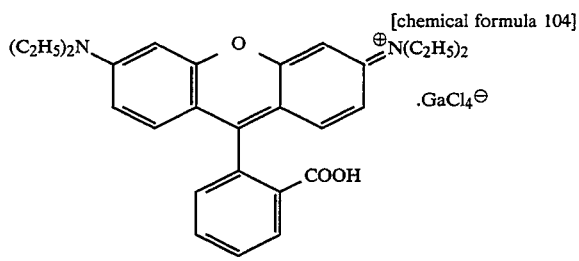

[chemical formula 104]

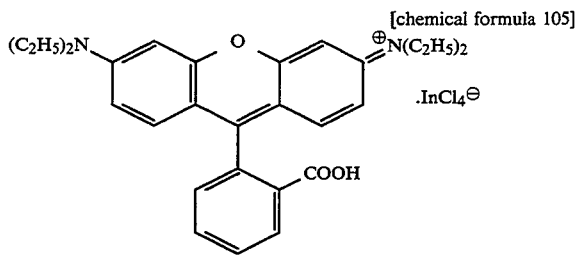

[chemical formula 105]

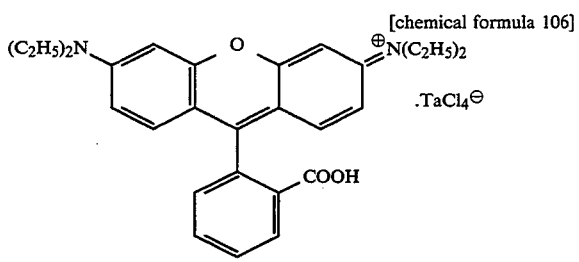

[chemical formula 106]

-continued

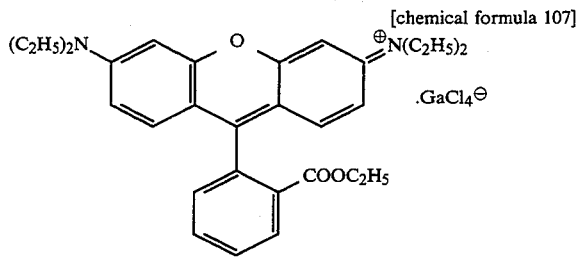
[chemical formula 107]

8. An EL element of claim 2, wherein said organic luminous layer comprises said chromone metal complex, and said organic hole transport layer comprises an organic compound that has larger exciton energy than said chromone metal complex.

9. An EL element of claim 8, wherein a metal of said chromone metal complex is one of beryllium and scandium.

10. An EL element of claim 9, wherein a ligand of said chromone metal complex is a 5-hydroxychromone derivative.

11. An EL element of claim 10, wherein said chromone metal complex is a compound shown in chemical formula 108:

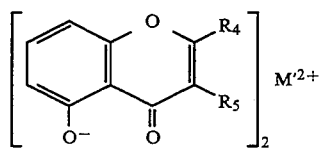
[chemical formula 108]

wherein $R_4$ and $R_5$ are selected from the group consisting of $CH_3$, $C_2H_5$, H, and $C_6H_5$ which is shown in chemical formula 109, and M' is zinc.

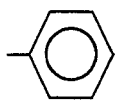
[chemical formula 109]

12. An EL element of claim 11, wherein polyvinylcarbazole is used for said organic hole transport layer.

13. An EL element of claim 12, wherein said chromone metal complex is selected from the group consisting of chemical formulas 110, 111, and 112:

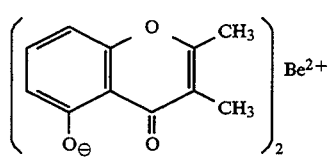
[chemical formula 110]

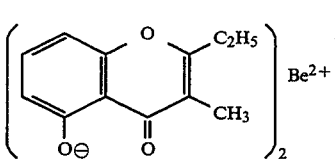
[chemical formula 111]

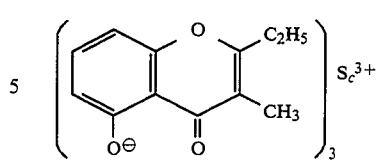
[chemical formula 112]

14. An EL element of claim 2, wherein said organic luminous layer comprises said azomethine metal complex.

15. An EL element of claim 14, wherein said electron transport layer comprises an organic compound that has larger exciton energy than said azomethine metal complex.

16. An EL element of claim 15, wherein a metal of said azomethine metal complex is selected from one of the II group and the III group in the periodic table.

17. An EL element of claim 16, wherein said azomethine metal complex is selected from the group consisting of a compound shown in chemical formula 113, another compound shown in chemical formula 114, an azomethine metal complex whose ligand is an azomethine compound composed of an amino acid, amine, and a salicylaldehyde derivative, and another azomethine metal complex whose ligand is an azomethine compound composed of an amino acid, amine, and a 2-hydroxy-1-naphthaldehyde derivative:

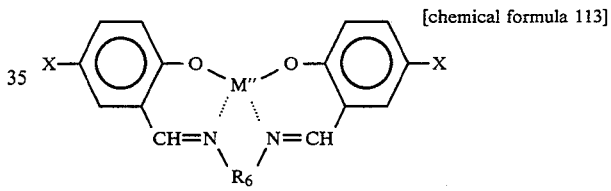
[chemical formula 113]

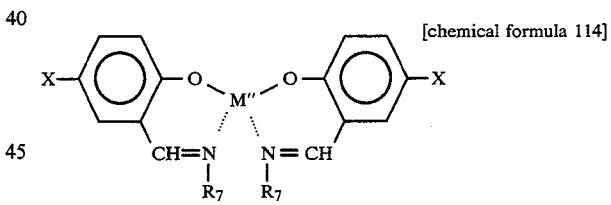
[chemical formula 114]

wherein $R_6$ is selected from the group consisting of $C_nH_{2n}$ (n is an integer from 0 to 20 inclusive), $C_6H_4$ which is shown in chemical formula 115, and $C_{10}H_6$ which is shown in chemical formula 116:

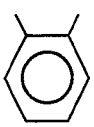
[chemical formula 115]

[chemical formula 116]

wherein $R_7$ is selected from the group consisting of $C_nH_{2n+1}$ (n is an integer from 0 to 10 inclusive), $C_6H_5$ which is shown in chemical formula 117, and $CH_2(C_6H_5)$ which is shown in chemical formula 118:

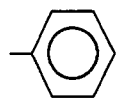

[chemical formula 117]

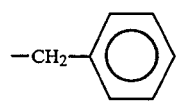

[chemical formula 118]

wherein X is selected from the group consisting of $C_nH_{2n+1}$ (n is an integer from 0 to 10 inclusive), CN, $N(CH_3)_2$, $NH_2$, H, halogen, OH, $OCH_3$, and M" is one of zinc and beryllium.

18. An EL element of claim 17, wherein said organic hole transport layer comprises a diamine derivative.

19. An EL element of claim 18, wherein said diamine derivative is shown in chemical formula 119, and said azomethine metal complex used for said organic luminous layer is selected from the group consisting of chemical formulas 120, 121, 122, 123, and 124.

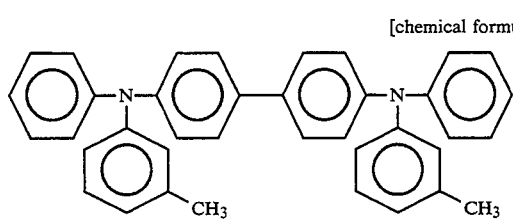

[chemical formula 119]

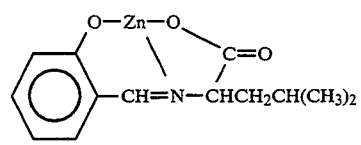

[chemical formula 120]

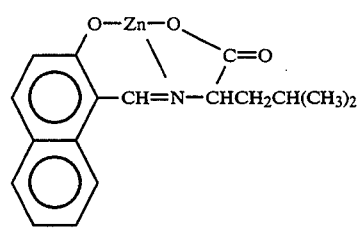

[chemical formula 121]

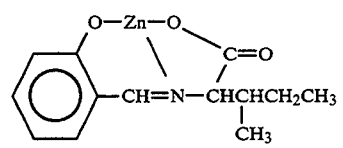

[chemical formula 122]

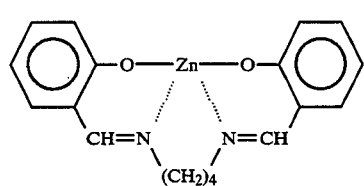

[chemical formula 123]

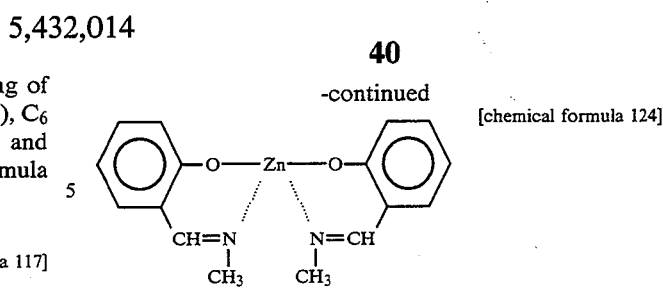

[chemical formula 124]

20. An EL element of claim 14, wherein said organic luminous layer comprises said azomethine metal complex as a base material, and a compound as a dopant, said compound being different from the compound used as the base material.

21. An EL element of claim 20, wherein a metal of said azomethine metal complex belongs to the group II in the periodic table.

22. An EL element of claim 21, wherein said azomethine metal complex is one of the compounds shown in chemical formulas 125 and 126:

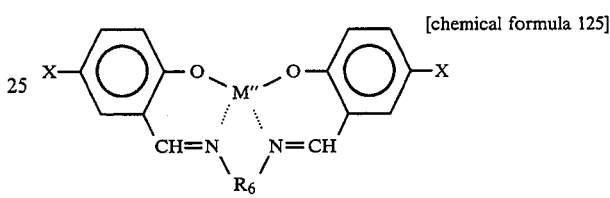

[chemical formula 125]

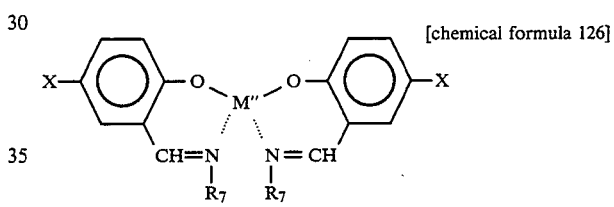

[chemical formula 126]

wherein $R_6$ is selected from the group consisting of $C_nH_{2n}$ (n is an integer from 0 to 20 inclusive), $C_6H_4$ which is shown in chemical formula 127, and $C_{10}H_6$ which is shown in chemical formula 128:

[chemical formula 127]

[chemical formula 128]

wherein $R_7$ is selected from the group consisting of $C_nH_{2n+1}$ (n is an integer from 0 to 10 inclusive), $C_6H_5$ which is shown in chemical formula 129, and $CH_2(C_6H_5)$ which is shown in chemical formula 130:

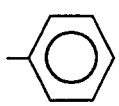

[chemical formula 129]

-continued

[chemical formula 130]

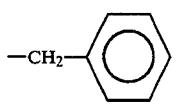

wherein X is selected from the group consisting of $C_nH_{2n+1}$ (n is an integer from 0 to 10 inclusive), CN, $N(CH_3)_2$, $NH_2$, halogen, OH, and $OCH_3$, and M'' is one of zinc and beryllium.

23. An EL element of claim 22, wherein a diamine derivative is used for said organic hole transport layer.

24. An EL element of claim 23, wherein said diamine derivative is shown in chemical formula 131, said azomethine metal complex used as the base material is shown in chemical formula 132, and the compound used as the dopant is beryllium-8-quinolinol shown in chemical formula 133:

[chemical formula 131]

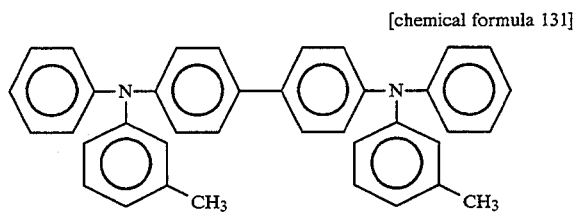

[chemical formula 132]

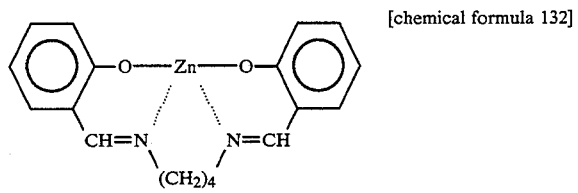

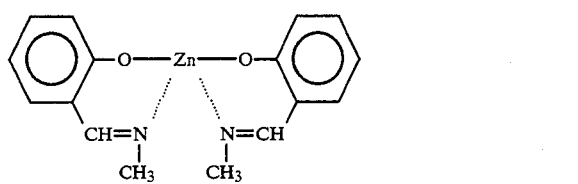

[chemical formula 133]

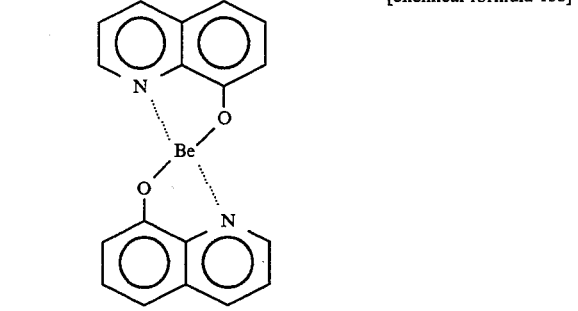

25. An EL element of claim 14, wherein said organic luminous layer comprises said azomethine metal complex as a dopant and a compound as a base material, said compound being different from the compound used as the dopant.

26. An EL element of claim 25, wherein a metal of said azomethine metal complex belongs to the group II in the periodic table.

27. An EL element of claim 26, wherein said azomethine metal complex is one of the compounds shown in chemical formulas 134 and 135:

[chemical formula 134]

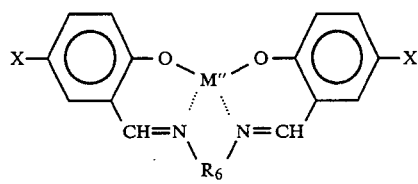

[chemical formula 135]

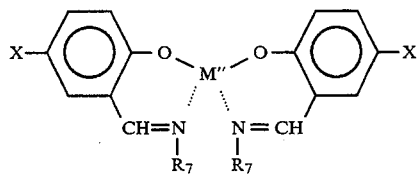

wherein $R_6$ is selected from the group consisting of $C_nH_{2n}$ (n is an integer from 0 to 20 inclusive), $C_6H_4$ which is shown in chemical formula 136, and $C_{10}H_6$ which is shown in chemical formula 137:

[chemical formula 136]

[chemical formula 137]

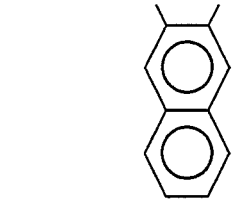

wherein $R_7$ is selected from the group consisting of $C_nH_{2n+1}$ (n is an integer from 0 to 10 inclusive), $C_6H_5$ which is shown in chemical formula 138, and $CH_2(C_6H_5)$ which is shown in chemical formula 139:

[chemical formula 138]

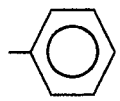

[chemical formula 139]

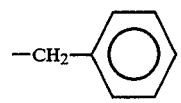

wherein X is selected from the group consisting of $C_nH_{2n+1}$ (n is an integer from 0 to 10 inclusive), CN, $N(CH_3)_2$, $NH_2$, halogen, OH, and $OCH_3$, and M'' is one of zinc and beryllium.

28. An EL element of claim 1, wherein there are two layers between said electrodes, one being an organic luminous layer, the other being an organic electron transport layer, and said organic electron transport layer is provided between said organic luminous layer and said electron injection electrode.

29. An EL element of claim 28, wherein said organic luminous layer comprises said azomethine metal complex.

30. An EL element of claim 29, wherein said electron transport layer comprises an organic compound that has larger exciton energy than said azomethine metal complex.

31. An EL element of claim 30, wherein a metal of said azomethine metal complex is selected from one of the II group and the III group in the periodic table.

32. An EL element of claim 31, wherein said azomethine metal complex is selected from the group consisting of a compound shown in chemical formula 113, another compound shown in chemical formula 114, an azomethine metal complex whose ligand is an azomethine compound composed of an amino acid, amine, and a salicylaldehyde derivative, and another azomethine metal complex whose ligand is an azomethine compound composed of an amino acid, amine, and a 2-hydroxy-1-naphthaldehyde derivative

[chemical formula 140]

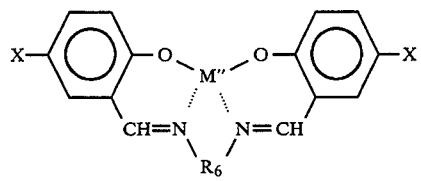

[chemical formula 141]

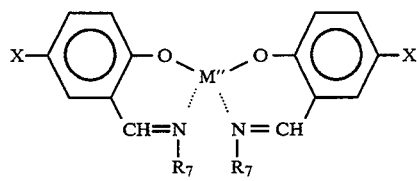

wherein $R_6$ is selected from the group consisting of $C_nH_{2n}$ (n is an integer from 0 to 20 inclusive), $C_6H_4$ which is shown in chemical formula 142, and $C_{10}H_6$ which is shown in chemical formula 143:

[chemical formula 142]

[chemical formula 143]

wherein $R_7$ is selected from the group consisting of $C_nH_{2n+1}$ (n is an integer from 0 to 10 inclusive), $C_6H_5$ which is shown in chemical formula 144, and $CH_2(C_6H_5)$ which is shown in chemical formula 145:

[chemical formula 144]

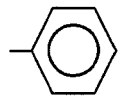

[chemical formula 145]

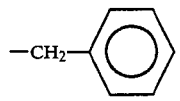

wherein X is selected from the group consisting of $C_nH_{2n+1}$ (n is an integer from 0 to 10 inclusive), CN, $N(CH_3)_2$, $NH_2$, halogen, OH, $OCH_3$, and M" is one of zinc and beryllium.

33. An EL element of claim 29, wherein said organic luminous layer comprises said azomethine metal complex as a base material, and a compound as a dopant, said compound being different from the compound used as the base material.

34. An EL element of claim 33, wherein a metal of said azomethine metal complex belongs to the group II in the periodic table.

35. An EL element of claim 34, wherein said azomethine metal complex is one of the compounds shown in chemical formulas 146 and 147:

[chemical formula 146]

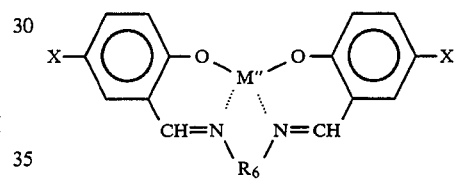

[chemical formula 147]

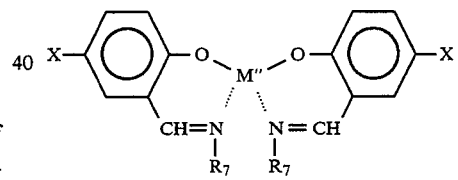

wherein $R_6$ is selected from the group consisting of $C_nH_{2n}$ (n is an integer from 0 to 20 inclusive), $C_6H_4$ which is shown in chemical formula 148, and $C_{10}H_6$ which is shown in chemical formula 149:

[chemical formula 148]

[chemical formula 149]

wherein $R_7$ is selected from the group consisting of $C_nH_{2n+1}$ (n is an integer from 0 to 10 inclusive), $C_6H_5$ which is shown in chemical formula 150, and $CH_2(C_6H_5)$ which is shown in chemical formula 151:

[chemical formula 150]

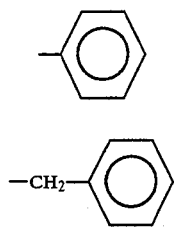

[chemical formula 151]

$-CH_2-$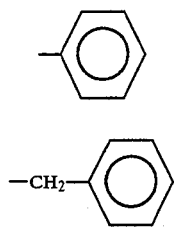

wherein X is selected from the group consisting of $C_nH_{2n+1}$ (n is an integer from 0 to 10 inclusive), CN, $N(CH_3)_2$, $NH_2$, halogen, OH, and $OCH_3$, and M" is one of zinc and beryllium.

36. An EL element of claim 29, wherein said organic luminous layer comprises said azomethine metal complex as a dopant and a compound as a base material, said compound being different from the compound used as the dopant.

37. An EL element of claim 36, wherein a metal of said azomethine metal complex belongs to the group II in the periodic table.

38. An EL element of claim 37, wherein said azomethine metal complex is one of the compounds shown in chemical formulas 152 and 153:

[chemical formula 152]

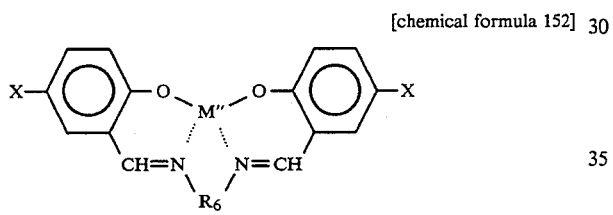

[chemical formula 153]

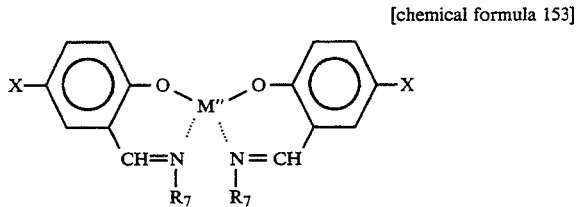

wherein $R_6$ is selected from the group consisting of $C_nH_{2n}$ (n is an integer from 0 to 20 inclusive), $C_6H_4$ which is shown in chemical formula 154, and $C_{10}H_6$ which is shown in chemical formula 155:

[chemical formula 154]

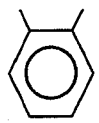

[chemical formula 155]

wherein $R_7$ is selected from the group consisting of $C_nH_{2n+1}$ (n is an integer from 0 to 10 inclusive), $C_6H_5$ which is shown in chemical formula 156, and $CH_2(C_6H_5)$ which is shown in chemical formula 157:

[chemical formula 156]

[chemical formula 157]

$-CH_2-$

wherein X is selected from the group consisting of $C_nH_{2n+1}$ (N is an integer from 0 to 10 inclusive), CN, $N(CH_3)_2$, $NH_2$, halogen, OH, and $OCH_3$, and M" is one of zinc and beryllium.

39. An EL element of claim 28, wherein said organic electron transport layer comprises said azomethine metal complex, and said organic luminous layer comprises an organic compound that has less exciton energy than said azomethine metal complex.

40. An EL element of claim 39, wherein a metal of said azomethine metal complex belongs to the group II in the periodic table.

41. An EL element of claim 40, wherein said azomethine metal complex is one of the compounds shown in chemical formulas 158 and 159:

[chemical formula 158]

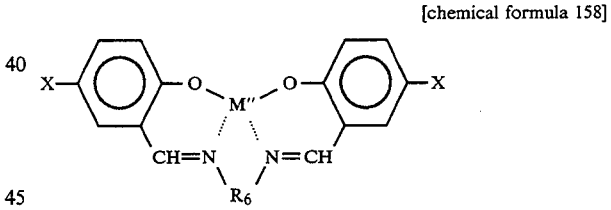

[chemical formula 159]

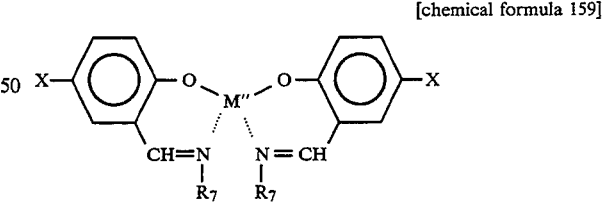

wherein $R_6$ is selected from the group consisting of $C_nH_{2n}$ (n is an integer from 0 to 20 inclusive), $C_6H_4$ which is shown in chemical formula 160, and $C_{10}H_6$ which is shown in chemical formula 161:

[chemical formula 160]

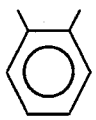

-continued

[chemical formula 161]

wherein R$_7$ is selected from the group consisting of C$_n$H$_{2n+1}$ (n is an integer from 0 to 10 inclusive), C$_6$H$_5$ which is shown in chemical formula 162, and CH$_2$(C$_6$H$_5$) which is shown in chemical formula 163:

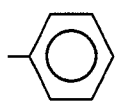
[chemical formula 162]

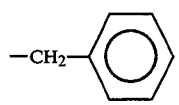
[chemical formula 163]

wherein X is selected from the group consisting of C$_n$H$_{2n+1}$ (n is an integer from 0 to 10 inclusive), CN, N(CH$_3$)$_2$, NH$_2$, halogen, OH, and OCH$_3$, and M" is one of zinc and beryllium.

42. An EL element of claim 1, wherein there are three layers between said electrodes, one being an organic luminous layer, another being an organic electron transport layer, the other being an organic hole transport layer, said organic electron transport layer is provided between said organic luminous layer and said electron injection electrode, and said organic hole transport layer is provided between said organic luminous layer and said hole injection layer.

43. An EL element of claim 42, wherein said organic luminous layer comprises said Rhodamine metal complex, said organic electron transport layer comprises an organic compound that has larger exciton energy than said Rhodamine metal complex, and said organic hole transport layer comprises an organic compound that has larger exciton energy than said Rhodamine metal complex.

44. An EL element of claim 43, wherein a metal of said Rhodamine metal complex belongs to the group III in the periodic table.

45. An EL element of claim 44, wherein said Rhodamine metal complex comprises a compound shown in chemical formula 164:

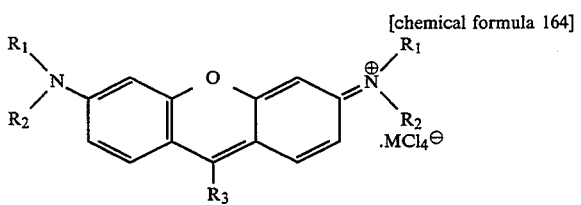
[chemical formula 164]

wherein R$_1$ and R$_2$ are selected from the group consisting of H, CH$_3$, and C$_2$H$_5$,
R$_3$ is selected from the group consisting of H, C$_2$H$_4$COOH, C$_6$H$_4$(COOH) which is shown in chemical formula 165, and C$_6$H$_4$(COOC$_2$H$_5$) which is shown in chemical formula 166:

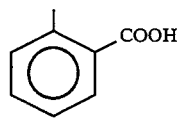
[chemical formula 165]

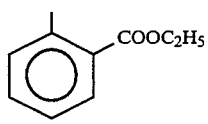
[chemical formula 166]

and M is selected from the group consisting of gallium, indium, and thallium.

46. An EL element of claim 42, wherein said organic luminous layer comprises said chromone metal complex, said organic electron transport layer comprises an organic compound that has larger exciton energy than said chromone metal complex, and said organic hole transport layer comprises an organic compound that has larger exciton energy than said chromone metal complex.

47. An EL element of claim 46, wherein a metal of chromone metal complex is one of beryllium and scandium.

48. An EL element of claim 47, wherein a ligand of said chromone metal complex is a 5-hydroxychromone derivative.

49. An EL element of claim 42, wherein said organic luminous layer comprises said azomethine metal complex.

50. An EL element of claim 49, wherein said electron transport layer comprises an organic compound that has larger exciton energy than said azomethine metal complex.

51. An EL element of claim 50, wherein a metal of said azomethine metal complex is selected from one of the II group and the III group in the periodic table.

52. An EL element of claim 51, wherein said azomethine metal complex is selected from the group consisting of a compound shown in chemical formula 113, another compound shown in chemical formula 114, an azomethine metal complex whose ligand is an azomethine compound composed of an amino acid, amine, and a salicylaldehyde derivative, and another azomethine metal complex whose ligand is an azomethine compound composed of an of amino acid, amine, and a 2-hydroxy-1-naphthaldehyde derivative:

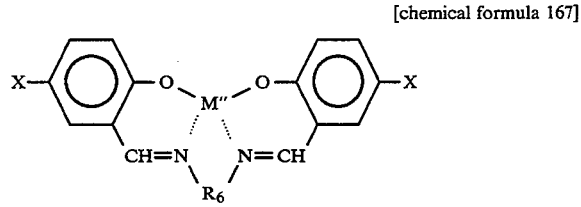
[chemical formula 167]

-continued

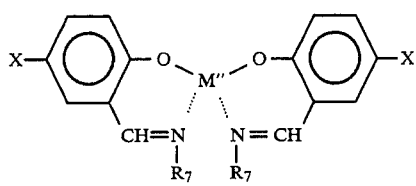
[chemical formula 168]

wherein $R_6$ is selected from the group consisting of $C_nH_{2n}$ (n is an integer from 0 to 20 inclusive), $C_6H_4$ which is shown in chemical formula 169, and $C_{10}H_6$ which is shown in chemical formula 170:

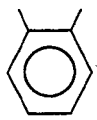
[chemical formula 169]

[chemical formula 170]

wherein $R_7$ is selected from the group consisting of $C_nH_{2n+1}$ (n is an integer from 0 to 10 inclusive), $C_6H_5$ which is shown in chemical formula 171, and $CH_2(C_6H_5)$ which is shown in chemical formula 172:

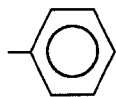
[chemical formula 171]

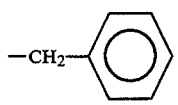
[chemical formula 172]

wherein X is selected from the group consisting of $C_nH_{2n+1}$ (n is an integer from 0 to 10 inclusive), CN, $N(CH_3)_2$, $NH_2$, halogen, OH, and $OCH_3$, and M" is one of zinc and beryllium.

53. An EL element of claim 49, wherein said organic luminous layer comprises said azomethine metal complex as a base material, and a compound as a dopant, said compound being different from the compound used as the base material.

54. An EL element of claim 53, wherein a metal of said azomethine metal complex belongs to the group II in the periodic table.

55. An EL element of claim 54, wherein said azomethine metal complex is one of the compounds shown in chemical formulas 173 and 174:

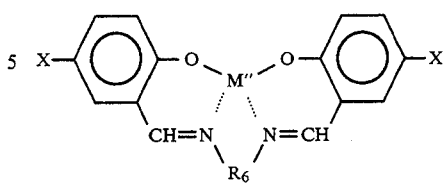
[chemical formula 173]

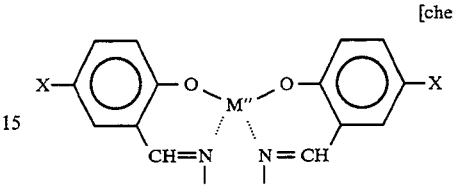
[chemical formula 174]

wherein $R_6$ is selected from the group consisting of $C_nH_{2n}$ (n is an integer from 0 to 20 inclusive), $C_6H_4$ which is shown in chemical formula 175, and $C_{10}H_6$ which is shown in chemical formula 176:

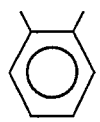
[chemical formula 175]

[chemical formula 176]

wherein $R_7$ is selected from the group consisting of $C_nH_{2n+1}$ (n is an integer from 0 to 10 inclusive), $C_6H_5$ which is shown in chemical formula 177, and $CH_2(C_6H_5)$ which is shown in chemical formula 178:

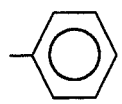
[chemical formula 177]

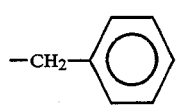
[chemical formula 178]

wherein X is selected from the group consisting of $C_nH_{2n+1}$ (n is an integer from 0 to 10 inclusive), CN, $N(CH_3)_2$, $NH_2$, halogen, OH, and $OCH_3$, and M" is one of zinc and beryllium.

56. An EL element of claim 49, wherein said organic luminous layer comprises said azomethine metal complex as a dopant and a compound as a base material, said compound being different from the compound used as the dopant.

57. An EL element of claim 56, wherein a metal of said azomethine metal complex belongs to the group II in the periodic table.

58. An EL element of claim 57, wherein said azomethine metal complex is one of the compounds shown in chemical formulas 179 and 180:

[chemical formula 179]

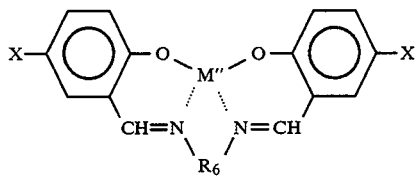

[chemical formula 180]

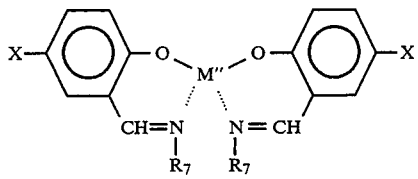

wherein $R_6$ is selected from the group consisting of $C_nH_{2n}$ (n is an integer from 0 to 20 inclusive), $C_6H_4$ which is shown in chemical formula 181, and $C_{10}H_6$ which is shown in chemical formula 182:

[chemical formula 181]

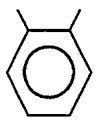

[chemical formula 182]

wherein $R_7$ is selected from the group consisting of $C_nH_{2n+1}$ (n is an integer from 0 to 10 inclusive), $C_6H_5$ which is shown in chemical formula 183, and $-CH_2(C_6H_5)$ which is shown in chemical formula 184:

[chemical formula 183]

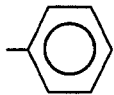

[chemical formula 184]

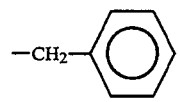

wherein X is selected from the group consisting of $C_nH_{2n+1}$ (n is an integer from 0 to 10 inclusive), CN, $N(CH_3)_2$, $NH_2$, halogen, OH, and $OCH_3$, and M'' is one of zinc and beryllium.

59. An EL element of claim 42, wherein said organic electron transport layer comprises said azomethine metal complex, and said organic luminous layer comprises an organic compound that has less exciton energy than said azomethine metal complex.

60. An EL element of claim 59, wherein a metal of said azomethine metal complex belongs to the group II in the periodic table.

61. An EL element of claim 60, wherein said azomethine metal complex is one of the compounds shown in chemical formulas 185 and 186:

[chemical formula 185]

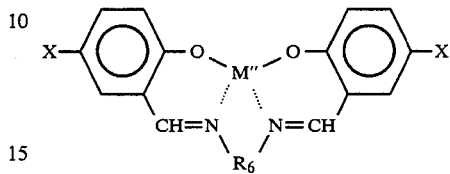

[chemical formula 186]

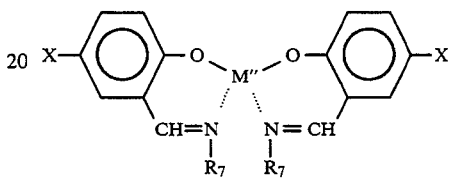

wherein $R_6$ is selected from the group consisting of $C_nH_{2n}$ (N is an integer from 0 to 20 inclusive), $C_6H_4$ which is shown in chemical formula 187, and $C_{10}H_6$ which is shown in chemical formula 188:

[chemical formula 187]

[chemical formula 188]

wherein $R_7$ is selected from the group consisting of $C_nH_{2n+1}$ (n is an integer from 0 to 10 inclusive), $C_6H_5$ which is shown in chemical formula 189, and $CH_2(C_6H_5)$ which is shown in chemical formula 190:

[chemical formula 189]

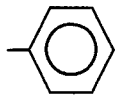

[chemical formula 190]

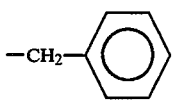

wherein X is selected from the group consisting of $C_nH_{2n+1}$ (n is an integer from 0 to 10 inclusive), CN, $N(CH_3)_2$, $NH_2$, halogen, OH, and $OCH_3$, and M'' is one of zinc and beryllium.

62. An EL element of claim 61, wherein said organic hole transport layer comprises a diamine derivative.

63. An EL element of claim 62, wherein said organic luminous layer comprises phtaloperinone.

64. An EL element of claim 63, wherein said organic electron transport layer comprises said azomethine metal complex shown in chemical formula 191, and said organic hole transport layer comprises said diamine derivative shown in chemical formula 192:

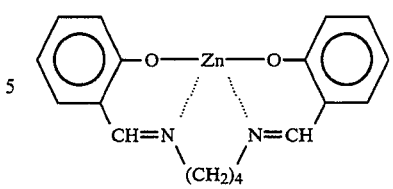

[chemical formula 191]

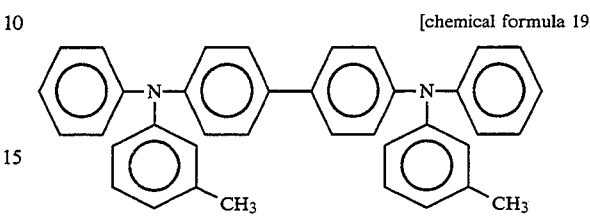

[chemical formula 192]

* * * * *